US012615901B2

(12) United States Patent
Mezouari et al.

(10) Patent No.: US 12,615,901 B2
(45) Date of Patent: Apr. 28, 2026

(54) MICRO LED BEAM COLLIMATION

(71) Applicant: Plessey Semiconductors Ltd, Plymouth (GB)

(72) Inventors: Samir Mezouari, Plymouth (GB); Robert Leslie Breakspear, Plymouth (GB); Colin Evestaff, Plymouth (GB)

(73) Assignee: Plessey Semiconductors Ltd, Plymouth (GB)

( * ) Notice: Subject to any disclaimer, the term of this patent is extended or adjusted under 35 U.S.C. 154(b) by 411 days.

(21) Appl. No.: 18/038,114

(22) PCT Filed: Nov. 25, 2021

(86) PCT No.: PCT/GB2021/053060
§ 371 (c)(1),
(2) Date: May 22, 2023

(87) PCT Pub. No.: WO2022/117995
PCT Pub. Date: Jun. 9, 2022

(65) Prior Publication Data
US 2024/0021656 A1 Jan. 18, 2024

(30) Foreign Application Priority Data
Dec. 1, 2020 (GB) ..................................... 2018920

(51) Int. Cl.
*H10H 29/14* (2025.01)
(52) U.S. Cl.
CPC ................................ *H10H 29/142* (2025.01)
(58) Field of Classification Search
CPC ............. H10H 29/142; H10H 20/0363; H10H 20/855; H10H 20/856; H01L 25/0753
See application file for complete search history.

(56) References Cited

U.S. PATENT DOCUMENTS

| | | | | |
|---|---|---|---|---|
| 10,658,558 B2 * | 5/2020 | Moran | ................. | H10H 20/855 |
| 10,964,850 B2 * | 3/2021 | Deckers | ............... | H10H 20/862 |

(Continued)

FOREIGN PATENT DOCUMENTS

| | | |
|---|---|---|
| CN | 110400519 A | 11/2019 |
| CN | 110729282 A | 1/2020 |

(Continued)

OTHER PUBLICATIONS

International Search Report and Written Opinion in PCT International Application No. PCT/GB2021/053060 mailed Mar. 1, 2022.

(Continued)

*Primary Examiner* — Victor A Mandala
(74) *Attorney, Agent, or Firm* — Cognition IP, P.C.; Edward Steakley

(57) ABSTRACT

A method of manufacturing a light emitting diode array comprising a first layer having a plurality of light emitting diodes arranged to emit light from a light emitting surface of the first layer, the method comprising: depositing a layer of dielectric material over the light emitting surface of the first layer; forming a plurality of apertures extending through the layer of dielectric material, each aperture having an internal surface that is at least partially reflective, wherein at least one aperture of the plurality of apertures is centered on and aligned with a light emitting diode of the plurality of light emitting diodes of the first layer, such that light emitted from light emitting diode is collimated as it passes through the at least one aperture.

15 Claims, 27 Drawing Sheets

(56)  References Cited

U.S. PATENT DOCUMENTS

| | | | | |
|---|---|---|---|---|
| 11,281,018 | B2* | 3/2022 | Qin | G02B 27/30 |
| 2001/0012047 | A1 | 8/2001 | Osawa et al. | |
| 2002/0074522 | A1 | 6/2002 | Zakar | |
| 2009/0242908 | A1* | 10/2009 | Liao | F21K 9/00 |
| | | | | 257/E33.068 |
| 2011/0062470 | A1 | 3/2011 | Bierhuizen et al. | |
| 2011/0169026 | A1* | 7/2011 | Tsai | G02B 6/4203 |
| | | | | 257/98 |
| 2011/0215342 | A1* | 9/2011 | Oliver | B29C 43/18 |
| | | | | 257/E33.059 |
| 2013/0021776 | A1 | 1/2013 | Veerasamy et al. | |
| 2014/0131836 | A1 | 5/2014 | Savastiouk et al. | |
| 2018/0090058 | A1* | 3/2018 | Chen | G09G 3/32 |
| 2020/0166767 | A1 | 5/2020 | Qin et al. | |
| 2020/0185513 | A1* | 6/2020 | Berglund | H10D 10/861 |
| 2020/0227592 | A1* | 7/2020 | Zhang | H10H 20/8512 |
| 2020/0335667 | A1* | 10/2020 | Deckers | F21S 41/663 |
| 2020/0349882 | A1* | 11/2020 | Kim | H10K 50/115 |

FOREIGN PATENT DOCUMENTS

| | | | |
|---|---|---|---|
| JP | 11078115 | A | 3/1999 |
| WO | 2013061228 | A1 | 5/2013 |

OTHER PUBLICATIONS

Patents Act 1977: Combined Search and Examination Report Under Section 17 and 18(3) in GB application No. GB2018920.5 mailed May 11, 2021.

Patents Act 1977: Examination Report Under Section 18(3) in GB application No. GB2018920.5 mailed Sep. 23, 2022.

Patents Act 1977: Examination Report Under Section 18(3) in GB application No. GB2018920.5 mailed Feb. 24, 2023.

Garcia-Gancedo, Luis, et al. "Ultrafast sputtered ZnO thin films with high k T for acoustic wave device applications." 2010 IEEE International Ultrasonics Symposium. IEEE, 2010.

* cited by examiner

| Height (um) | Angle Θ (deg) |
|---|---|
| 1 | 21.8 |
| 2 | 11.3 |
| 3 | 7.6 |
| 4 | 5.7 |
| 5 | 4.6 |

Figure 18

Light distribution for height H=1um

Emission Angle (degrees)

Intensity (W/sr)

MICRO LED BEAM COLLIMATION

CROSS-REFERENCE TO RELATED APPLICATIONS

This application is a 35 U.S.C. § 371 U.S. National Stage application of International Application No. PCT/GB2021/053060, filed on Nov. 25, 2021, which claims the benefit of priority of Great Britain application 2018920.5, filed on Dec. 1, 2020, which are incorporated herein by reference in their entirety.

FIELD OF THE INVENTION

The present disclosure relates to an LED array, an LED device comprising the monolithic LED array and a method of manufacture thereof. In particular, the present disclosure provides an LED array having improved light emission.

BACKGROUND OF THE INVENTION

Micro light emitting diode (LED) arrays may be defined as arrays of LEDs with a size of $100 \times 100 \ \mu m^2$ or less. Micro LED arrays are being developed for a number of commercial as well as military applications, such as self-emitting micro-displays and projectors, which may be incorporated into a variety of devices such as wearable displays, head-up displays, camcorders, viewfinders, multisite excitation sources, and pico-projectors.

Group III-nitride-based micro LEDs are inorganic semiconductor LEDs containing GaN and its alloys with InN and AlN in the active light-emitting region. Group III-nitride based micro LEDs are popular as they can be driven at significantly higher current density and emit a higher optical power density than conventional large area LEDs, especially organic light emitting diode (OLED) in which the light-emitting layer is an organic compound. As a result, higher luminance (brightness), defined as the amount of light emitted per unit area of the light source in a given direction, also measured in candela per square meter (cd/m2) and commonly referred to as a Nit (nt), makes micro LEDs suitable for applications requiring, or benefiting from, high brightness, e.g., displays in high brightness environments or projection.

Additionally, high luminous efficacy expressed in lumens per watt (lm/W) in group III-nitride micro LEDs, allows lower power usage compared with other light sources and makes micro LEDs particularly suitable for portable devices. Furthermore, owing to the intrinsic material properties of group III-nitrides, micro LEDs can be operated at extreme conditions such as high or low temperatures and humidity thereby providing a performance and reliability advantage in wearable and outdoor applications.

It is further known that light emitting diode (LED) devices provide efficient sources of light for a wide range of applications. Increases in LED light generation efficiency and extraction, along with the production of smaller LEDs (with smaller light emitting surface areas) and the integration of different wavelength LED emitters into arrays, has resulted in the provision of high quality colour arrays with multiple applications, in particular in display technologies.

Several display technologies are being considered and used for Micro LED Displays for use in various applications, including Augmented Reality, Merged Reality, Virtual Reality and Direct view displays, such as Smart Watches and Mobile devices. Technologies such as Digital Micro Mirrors (DMD) and Liquid Crystal on Silicon (LCoS) are based on reflective technologies, where an external light source is used to produce Red, Green and Blue photons in time sequential mode and the pixels either divert the light away from an optical element (DMD) or absorb light (LCoS) to adjust the brightness of a pixel in order to form an image. Liquid Crystal Displays (LCD) typically use a back light, an LCD panel on an addressable back plane and colour filters to produce an image. A back plane is required to turn individual pixels on and off and to adjust the brightness of individual pixels for each frame of video. Increasingly, emissive display technologies such as Organic Light Emitting Diode (OLED) or Active Matrix OLED (AMOLED) and more recently, Micro LED as they offer lower power consumption for untethered micro display applications and higher image contrast. Micro LED, in particular, offers higher efficiency and better reliability than micro OLED and AMOLED displays.

Standard micro LEDs emit light in an angular distribution close to a Lambertian emission, 120 degree full-width half-maximum. When coupling a micro-LED emissive display to a projection and/or a relay lens, only the light that is within the acceptance angle of the lens is used. For instance a typical F/3 lens has an acceptance angle of about +/−9.5 degree. Only 2.7% of the light emitted by a Lambertian micro-LED is within +/−9.5 degree and all the remaining 97.3% of the light is lost.

Existing solutions rely mainly on using extra optical elements to perform collimation. Such optical elements consist usually on a micro-lens array where each micro-lens is aligned with the individual micro-LED to collimate the emitted light. The mechanical alignment between the micro LED device and the optical component requires high precision (within 0.25 microns for a pixel pitch of 3 microns) to maintain the collimated beam distribution centred at the optical axis (normal to the micro LED emitting area).

SUMMARY OF THE INVENTION

In order to mitigate for at least some of the above-described problems, according to a first aspect of the invention, there is provided a method of manufacturing a light emitting diode array comprising a first layer having a plurality of light emitting diodes arranged to emit light from a light emitting surface of the first layer, the method comprising: depositing a layer of dielectric material over the light emitting surface of the first layer; forming a plurality of apertures extending through the layer of dielectric material, each aperture having an internal surface that is at least partially reflective, wherein at least one aperture of the plurality of apertures is centred on and aligned with a light emitting diode of the plurality of light emitting diodes of the first layer, such that light emitted from light emitting diode is collimated as it passes through the at least one aperture.

Advantageously, this method is highly suitable for mass manufacturing of LED devices with high optical efficiency and provides a unitary micro-LED device that achieves a narrow beam emission distribution via the collimation, wherein collimation is achieved using etched micro apertures on wafer, such that additional optical elements are not required to achieve a narrow emission distribution. The absence of additional optical elements not only reduces the component count of the device, but further simplifies manufacture by not requiring a step of aligning said optical elements with the underlying LEDs. Furthermore, the provision of a reflective aperture surrounding each individual LED provides enhanced optical isolation and helps prevent cross-talk between neighbouring dies and reduces considerably stray light when such LED array is coupled to an optical system. Moreover, the manufacturing processes set out below are suitable for small pitch LED wafers, providing the necessary high fidelity, and can be further carried at low temperatures that ensure the LEDs are not damaged or compromised by high temperature processing.

Preferably, the dielectric layer has a first surface extending over the light emitting surface of the first layer and a second opposing surface, and wherein the plurality of apertures are formed such that each aperture comprises a first opening in the first surface of the dielectric layer and a second opening in the second surface of the dielectric layer, wherein the second opening is larger than the first opening such that the apertures are frustum shaped.

Preferably, the first opening corresponds to the area of the underlying light emitting diode.

Preferably, the apertures are conical frustum shaped.

Preferably, the internal surface of the aperture is slanted at an angle of 7.5 degrees with respect to a plane normal to the dielectric layer.

Preferably, the second layer has a thickness between 1 and 5 microns.

Preferably, the internal surface of the apertures is coated with a reflective metal.

The provision of such internally reflective apertures over the underlying LEDs is shown to reduce the cut-off angle and improve the coupling efficiency of the LED device to a projection lens.

Preferably, the reflective metal is aluminium, which can be easily deposited using known techniques and subsequently mechanically or chemically polished.

Preferably, the reflective metal is deposited using a High-target-utilization sputtering (HiTUS) process. This beneficially allows for uniform thin film deposition within the apertures at low temperatures.

Preferably, the light emitting diodes of the first layer are spaced 3 microns apart.

Preferably, the dielectric layer is formed of one of silicon dioxide or a polymer.

Preferably, the formation of the plurality of apertures is achieved by depositing a hard mask material onto the second surface of the dielectric layer and patterning the hard mask material so as to expose areas of the dielectric layer that define a maximum width of the apertures, said maximum width being greater than the corresponding dimension of the underlying light emitting diode.

Preferably, the hard mask material is tungsten.

Preferably, the exposed areas of the dielectric layer are etched so as to produce an aperture having a slanted internal surface that extends from an opening in the second surface of the dielectric layer defined by the hard mask material to an opening in the first surface of the dielectric layer, wherein the opening in the first surface corresponds to the area of the underlying light emitting diode. This process, along with those outlined in the detailed description, allows for high resolution control of the position and profile of the apertures, allowing for the claimed method to be applied to small pitch LED wafers.

Preferably, the light emitting diode array is a monolithic light emitting diode array.

According to a second aspect of the invention, there is provided light emitting diode array comprising: a first layer having a plurality of light emitting diodes arranged to emit light from a light emitting surface of the first layer; and a dielectric layer extending over the light emitting surface of the first layer, the dielectric layer comprising; a plurality of apertures extending through the dielectric layer, each aperture having an internal surface that is at least partially reflective, wherein at least one aperture of the plurality of apertures is centred on and aligned with a light emitting diode of the plurality of light emitting diodes such that light emitted from the light emitting diode is collimated as it passes through the at least one aperture.

Further aspects of the invention will be apparent from the description and the appended claims.

DETAILED DESCRIPTION OF AN EMBODIMENT OF THE INVENTION

A detailed description of embodiments of the invention is described, by way of example only, with reference to the figures, in which:

FIG. 18 is a table of aperture height vs. angle of the sidewalls;

Figure 1:
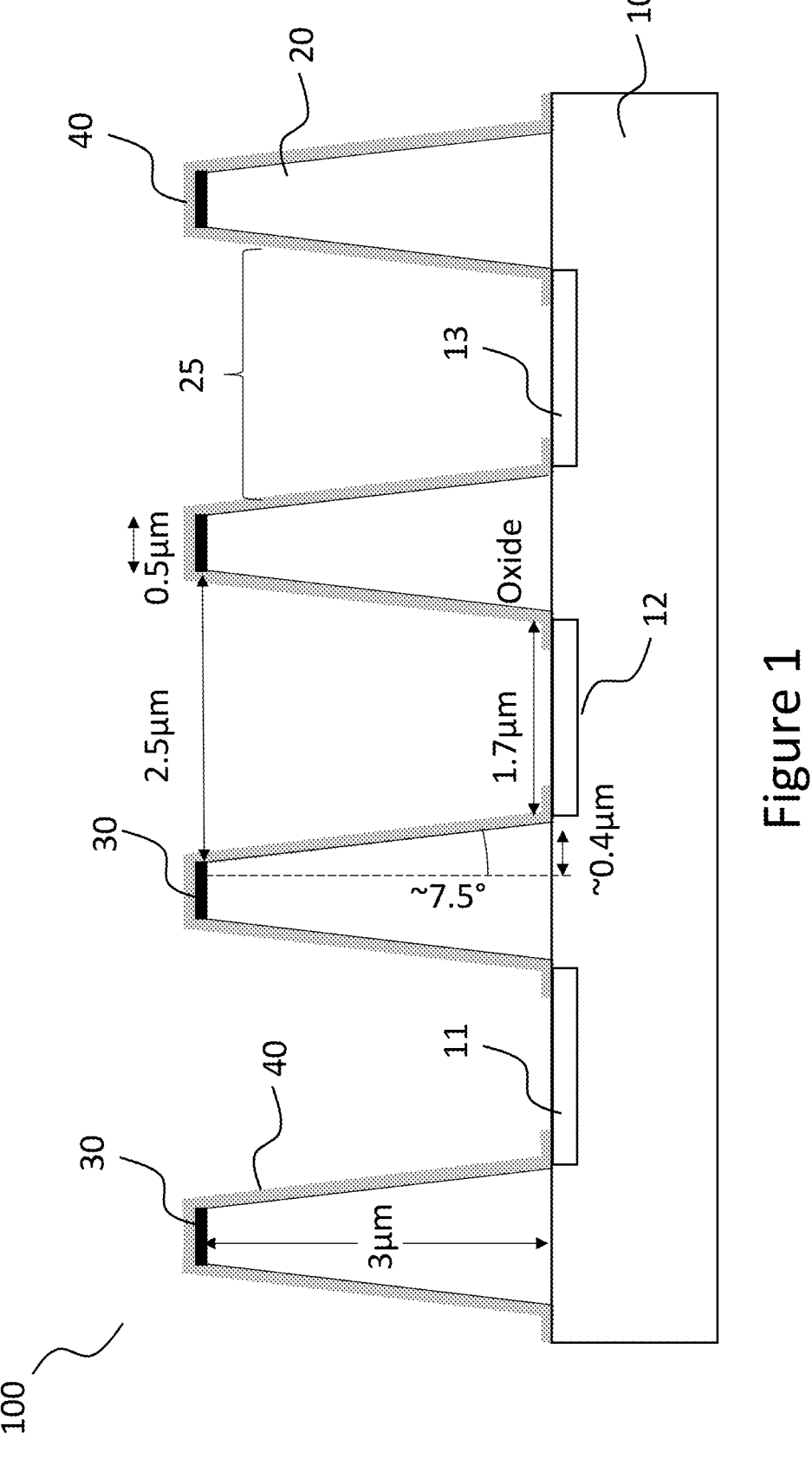
FIG. 1 shows a cross sectional view of a portion of a monolithic LED array according to an embodiment of the invention.

A cross sectional view of a monolithic micro LED array 100 is shown in FIG. 1. The array is formed from an LED wafer 10 having LEDs 11, 12 and 13 arranged to emit light from the top-most surface of the LED wafer 10 (known as the light emitting surface of the LED wafer 10). Each LED 11, 12, 13 has an associated light emitting surface. Whilst no electrical connections are shown, it is to be understood that each of the LEDs is separately addressable, thereby to control light from pixels defined by the light emitting surfaces associated with the LEDs 11 12, 13. The LED wafer 10 is provided via known techniques. In an embodiment, the LEDs 11, 12 and 13 are provided by GaN-based epitaxial multiple quantum well (MQW) structures grown by metalorganic chemical vapour deposition (MOCVD), having an n-type region and a p-type region sandwiching an active or light emitting region comprising one or more quantum wells. Such devices operate in a known manner and the skilled person would be aware of alternative structures incorporating one or more additional layers, or indeed any other suitable device provided they operate in the manner described below. Advantageously, monolithic arrays of LEDs with uniform structures and high internal quantum efficiency are combined with elegantly formed collimation structures to provide improved light output distribution with accurately controlled emission angles, fewer components and a reduced number of processing steps compared with known techniques.

Whilst the LED wafer 10 is a monolithic micro LED array, in further examples, the LED wafer 10 is formed in any appropriate manner to provide a layer having a plurality of light emitting diodes arranged to emit light from a plurality of light emitting surfaces. For example, the LED wafer 10 is provided by a layer of light emitting diodes formed by pick and place techniques.

The LEDs 11, 12, 13 are configured to emit light with different primary peak wavelengths. In an example, one LED 11 emits light with a primary peak wavelength that corresponds to red light (approximately 620 nm), one LED 12 emits light with a primary peak wavelength that corresponds to green light (approximately 520 nm) and one LED 13 emits light with a primary peak wavelength that corresponds to blue light (approximately 450 nm). In further examples, the LEDs 11, 12, 13 are configured to emit light with the same primary peak wavelength and/or comprise colour conversion regions to provide light with required wavelengths. Whilst three LEDs 11, 12, 13 are shown in FIG. 1, in further examples any appropriate number and configuration of LEDs is used to provide the functionality of collimated light emission described herein.

Arranged atop the LED wafer 10, and distributed over said light emitting surface, is a dielectric layer 20 having apertures/through-holes/cavities 25 wherein each aperture is centrally aligned with the LEDs of the underlying LED wafer 10. The apertures 25 have sloping sidewalls such that the width of each aperture increases with distance from the underlying LED. In a preferred embodiment, the apertures 25 have a frustoconical profile a height (or depth) of 3 microns and having openings 1.7 microns across at the interface with the LED wafer 10, extending to 2.5 microns at the opposing surface, with the sidewalls sloping at an angle of 7.5° over a width of 0.4 microns. In an alternative embodiment the apertures 25 have a parabolic profile which acts to further collimate light emitted from the LEDs. Though the skilled person would appreciate that the exact three-dimensional shape of the apertures 25 can vary with the shape of the underlying LEDs and the angular distribution of the light emitted therefrom. In an embodiment, the dielectric layer 20 is formed of silicon dioxide.

The uppermost surface of the dielectric layer (i.e. that opposing the surface of the dielectric layer 20 in contact with the light emitting surface of the LED wafer 10) is coated in a hard mask layer 30. Whilst the surface of the dielectric layer 20 is shown to be in contact with the LED wafer 10, in further examples the structure comprises one or more intervening layers between the LED wafer 10 and the dielectric layer 20. In an embodiment, the hard mask layer 30 is formed of tungsten.

Figure 16:
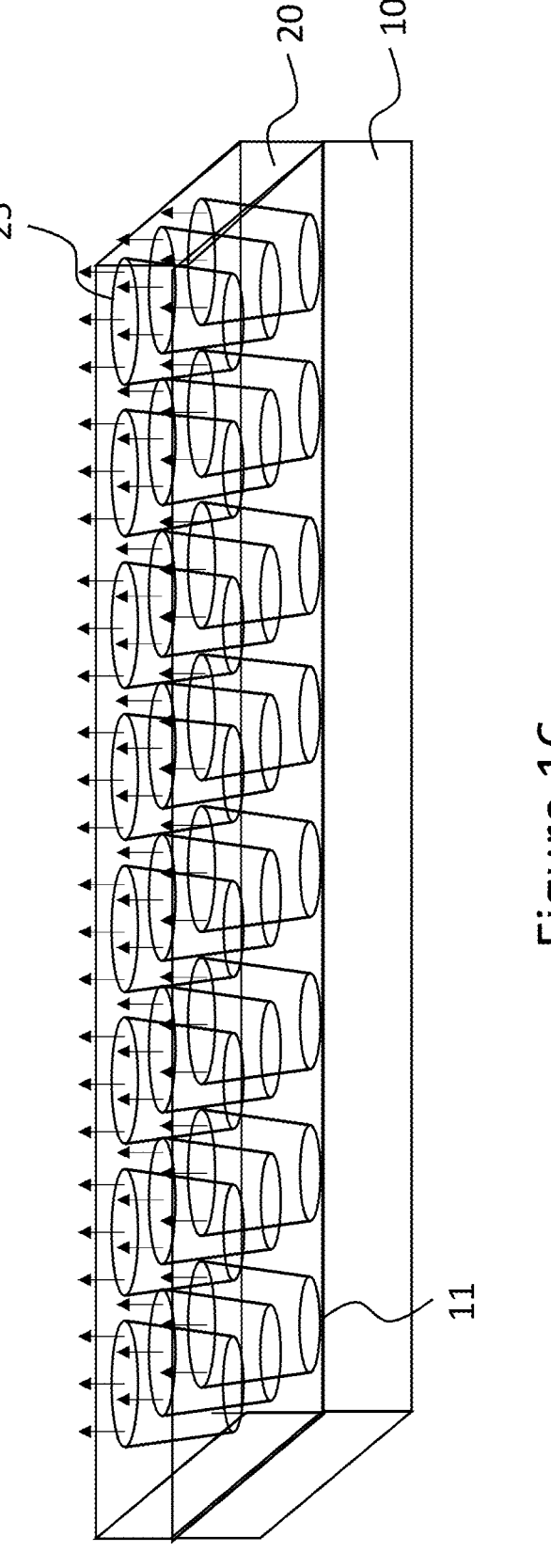
FIG. 16 shows an oblique view of a monolithic LED array according to an embodiment of the invention.

An outer layer of reflective material 40 is provided over the exposed internal surface of the apertures 25 and the hard mask layer 30 leaving the light emitting surfaces of the LEDs 11, 12 and 13 exposed. In an embodiment, the reflective material 40 is aluminium. An oblique view of the monolithic LED array is shown in FIG. 16 wherein the LEDs are arranged in red-green-blue (RGB) rows and arrows are provided to demonstrate the direction of light emitted from the LEDs 11, 12 and 13 through the apertures 25.

In use, light emitted from each of the LEDs 11, 12 and 13 undergoes internal reflection from the reflective material 40 coating the internal surface/sidewalls of the overlying aperture. This has the effect and collimating the light emitted from each individual LED of the monolithic LED array 100 such that optical coupling to any subsequent optics (such as to a projection or relay lens) is improved along with optical efficiency of the device as a whole. Cross-talk from neighbouring LEDs situated in the array 100 is also minimised.

FIGS. 2-8 depict the stages of manufacturing the monolithic LED array 100 of FIG. 1 according to an embodiment of the invention.

Figure 2:
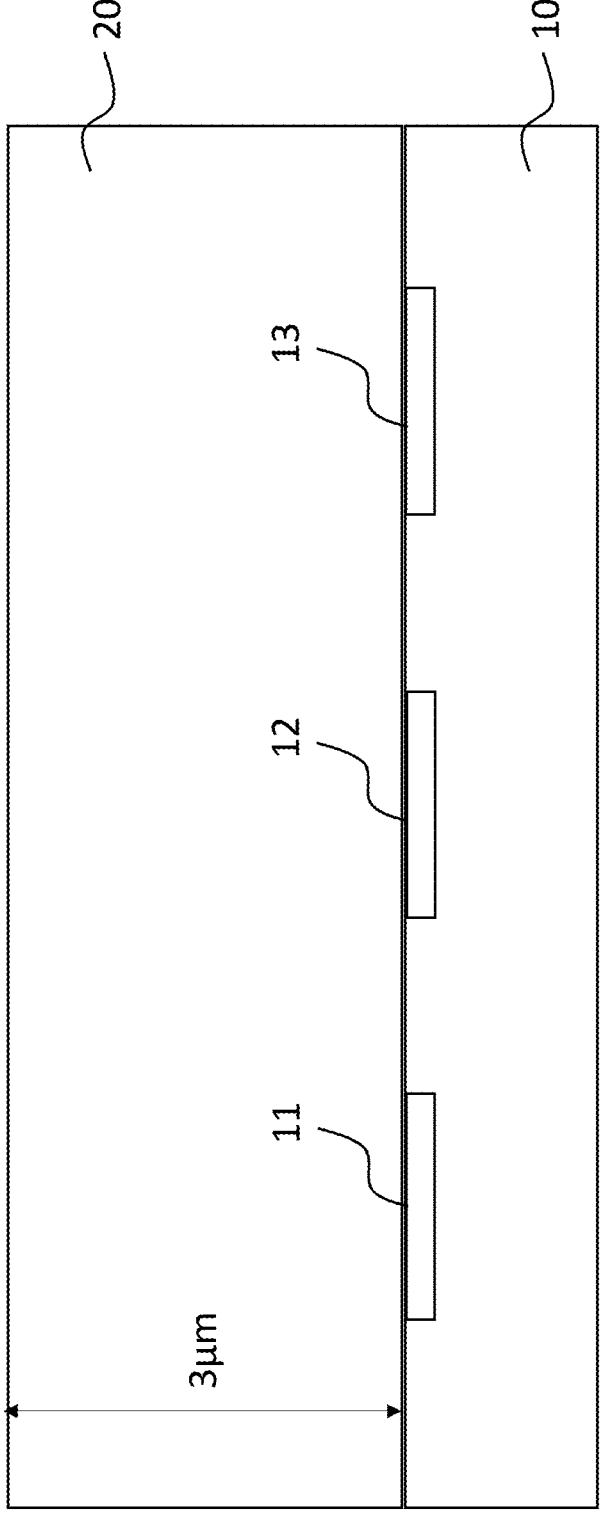
FIGS. 2-8 show the stages of the monolithic manufacturing process for the LED array according to an embodiment of the invention.

FIG. 2 shows the step of depositing a layer of dielectric material 20 on the LED wafer 10. In order to prevent damage to the micro LED devices on the wafer, a low temperature deposition method is preferred and is used to deposit a low stress silicon dioxide layer of approximately 3 micron thickness or more, though the layer could be thinner with smaller and more tightly packed LEDs.

Figure 3:
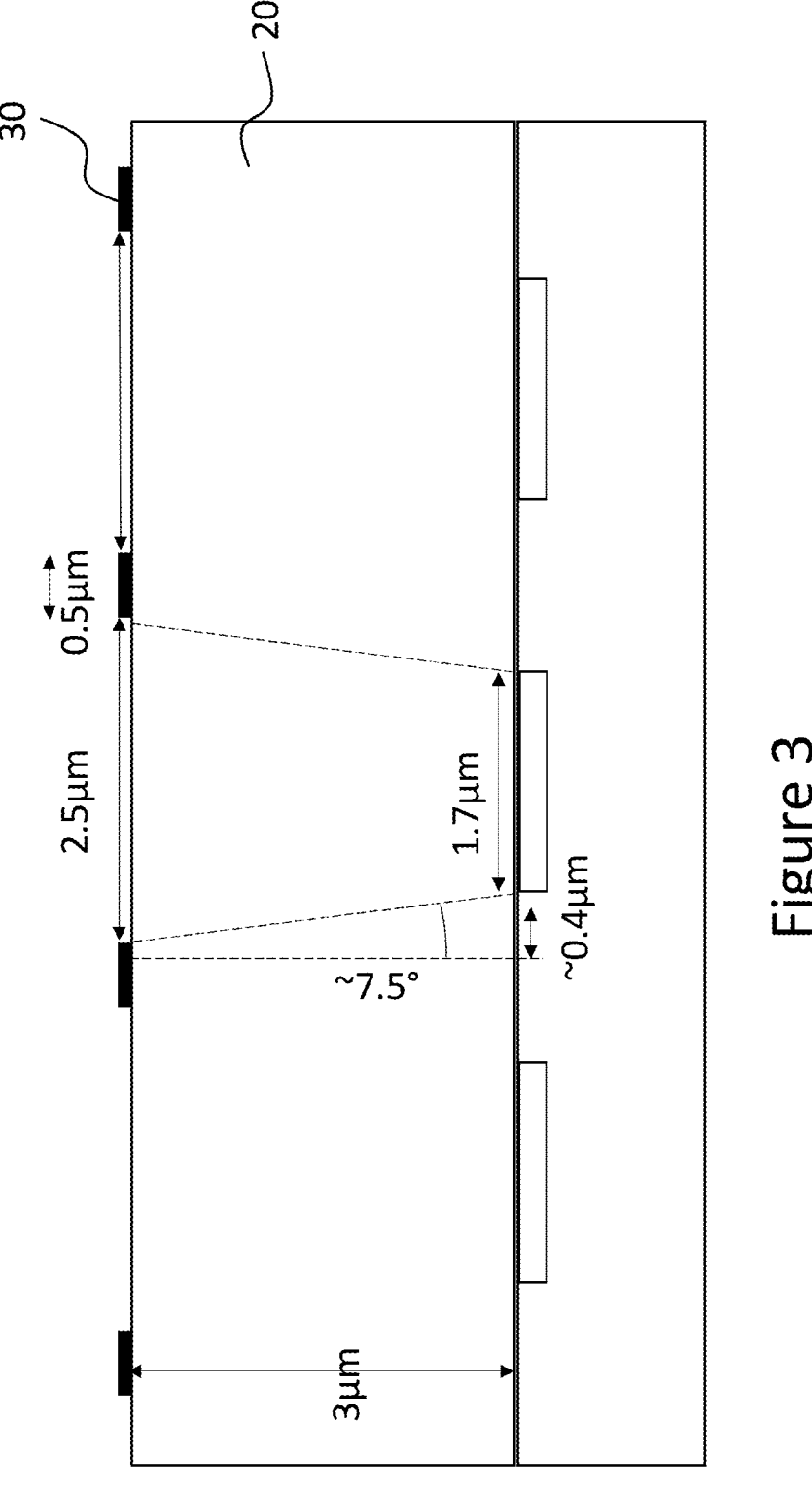

At the stage shown in FIG. 3, the top surface of the dielectric layer 20 is patterned ready for etching using a mask that contains openings that are centred on, and larger than the LEDs 11, 12 and 13 in the LED wafer 10. The mask openings are sized to allow for the etch sidewall angle such that the bottom of the etched apertures 25 will be similarly sized to the light-emitting surface of the LEDs 11, 12 and 13. In a preferred embodiment, a thin layer of material 30 is deposited (such as tungsten) on top of the dielectric layer 20 that will act as a hard mask for the dielectric etching. This hard mask 30 is patterned prior to etching the dielectric layer. This allows for relatively small geometries to be etched into the relatively thick dielectric layer without the need for a thick overlayer of photoresist, providing an improved process for producing microLED arrays. The hard mask can be patterned using either a (i) dry etching or (ii) lift off process.

In the case of (i), a thin layer of hard mask material 30 is deposited onto the dielectric layer and window openings are patterned over the position of the underlying LEDs 11, 12 and 13 using standard photolithography techniques that are known to the skilled person. The hard mask material 30 is then etched using a known dry etch technique and any photoresist from the photolithography is removed.

In the case of (ii), a layer of photoresist is deposited and an inverse pattern of openings is printed into the resist. The hard mask material 30 is then deposited over the photoresist and a standard lift-off technique is used to remove the hard mask material overlying the LEDs 11, 12 and 13, producing the structure shown in FIG. 3.

Figure 4:
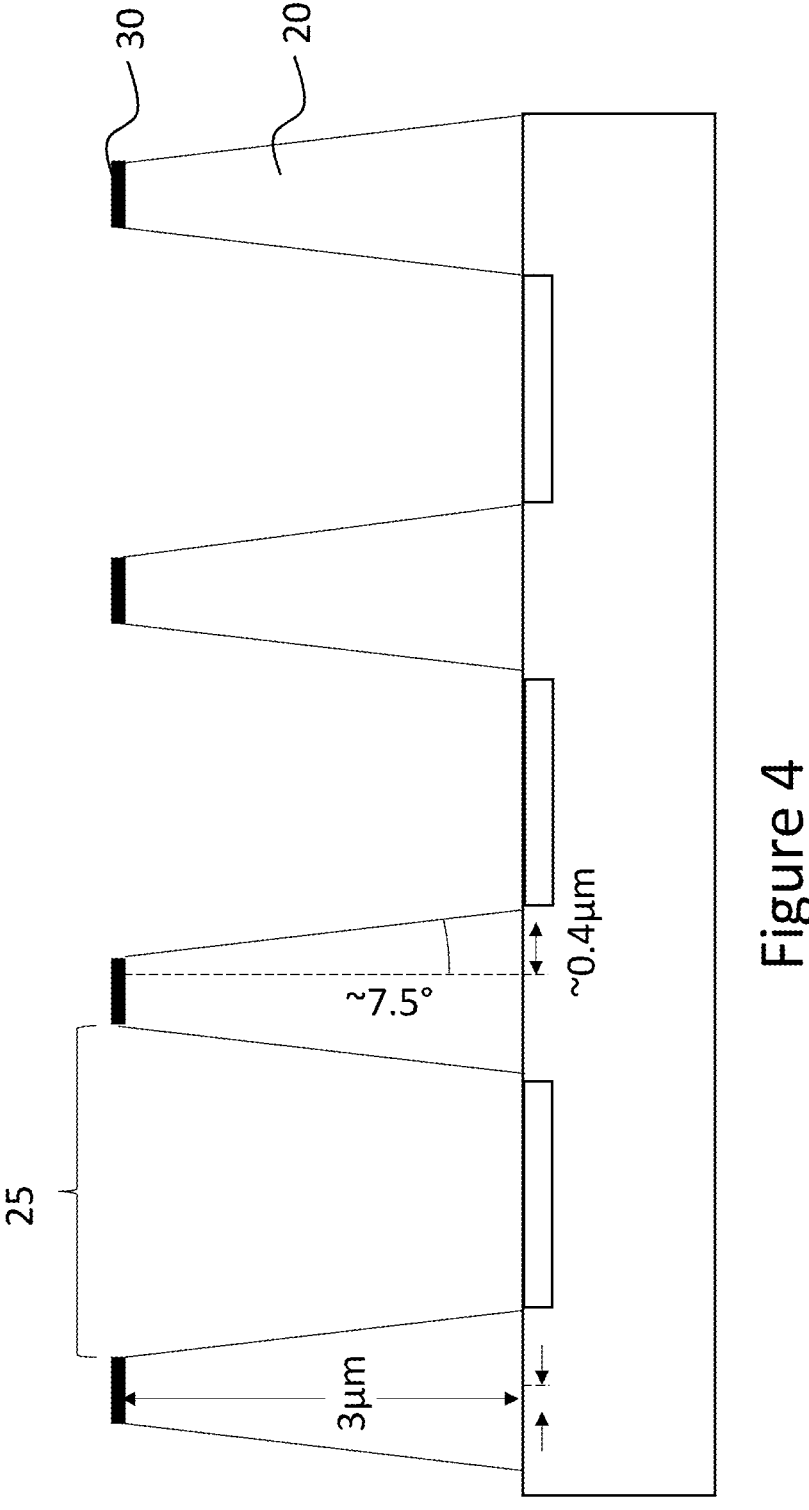

At the stage shown in FIG. 4, the dielectric material is etched via a known process so as to create apertures 25 between the islands of hard mask material 30 down to the LED wafer 10, each aperture 25 centred on an LED 11, 12 and 13. The angle of the aperture sidewalls (the internal surface of the apertures 25) is determined both by the thickness of the oxide layer and the etch chemistry.

Figure 5:
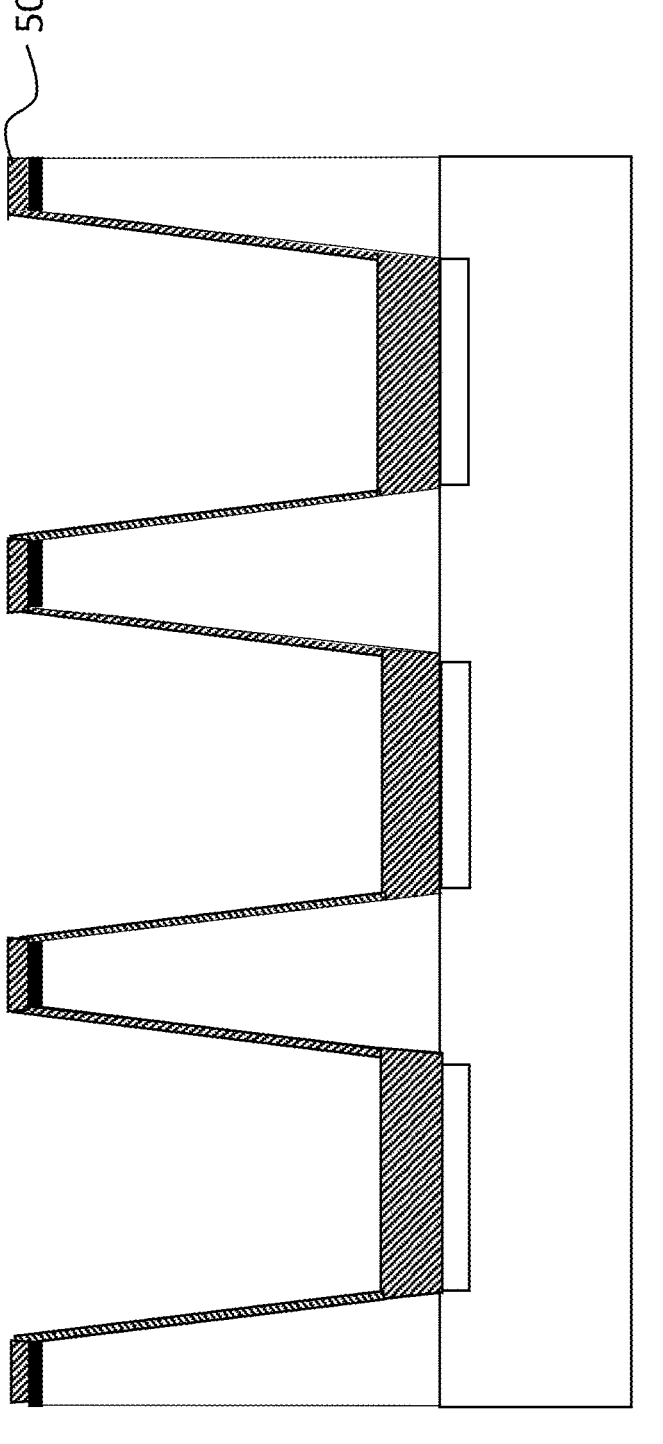
Figure 6:
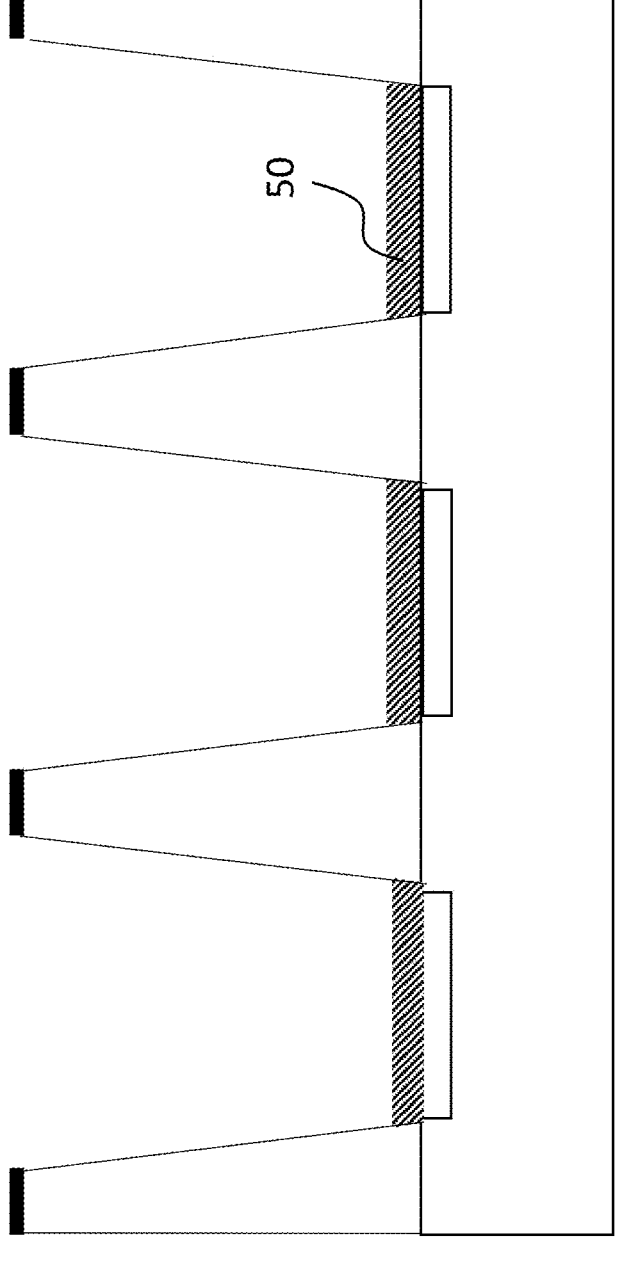

At FIGS. 5 and 6, the etched wafer is coated in a layer of photoresist 50 which is selectively developed or subjected to a selective lift-off so as to clear the photoresist 50 from the internal surface of the apertures 25, leaving their sidewalls exposed whilst maintaining a layer of photoresist 50 at the bottom of the etched apertures 25 over the LEDs of LED wafer 10. In a preferred embodiment, this is printed using a mask alignment process. In an alternative embodiment, this step is accomplished using a resist-etch-back technique such that the mask windows used to subsequently deposit the reflective material 40 can self-align to the windows in the mask used to pattern the dielectric material 20.

Figure 7:
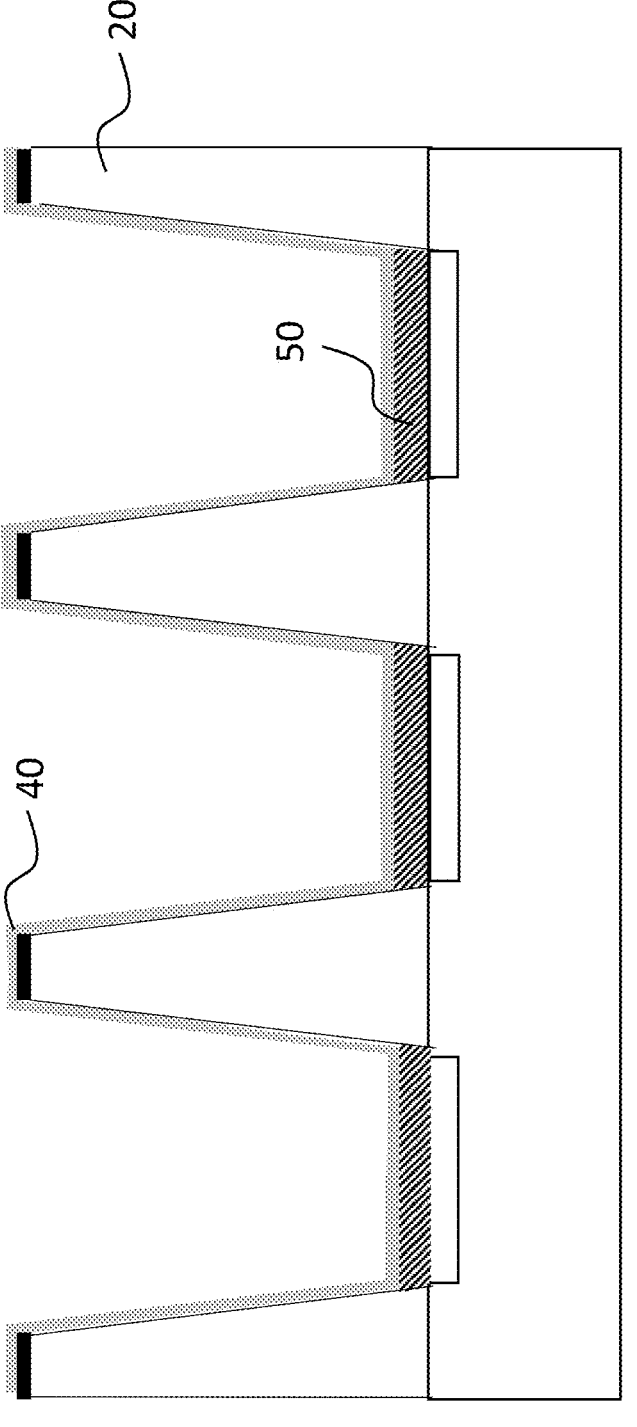

FIG. 7 shows the deposition of a thin layer of conformal reflective material 40 onto the exposed surface of the structure. In an embodiment, the material is aluminium and is deposited to a thickness of 50 nm. The deposition is preferably achieved using a High-target-utilization sputtering (HiTUS) method. Sputtering is performed by remote generation of a high density plasma. The plasma is generated in a side chamber opening into the main process chamber, containing the target and the substrate to be coated. As the plasma is generated remotely, and not from the target itself (as in conventional magnetron sputtering), the ion current to the target is independent of the voltage applied to the target. An optimal balance of plasma density and deposition rate is set to deliver a low energy 'plasma assist' to the deposition process without the need for substrate bias. This beneficially impacts the thin film coating properties and enhances the reactive deposition processes thereby resulting in the ability to coat fast deposition rate, high density films onto temperature sensitive polymeric substrates and allowing for uniform thin film deposition on the aperture sidewalls at low temperatures.

Figure 8:
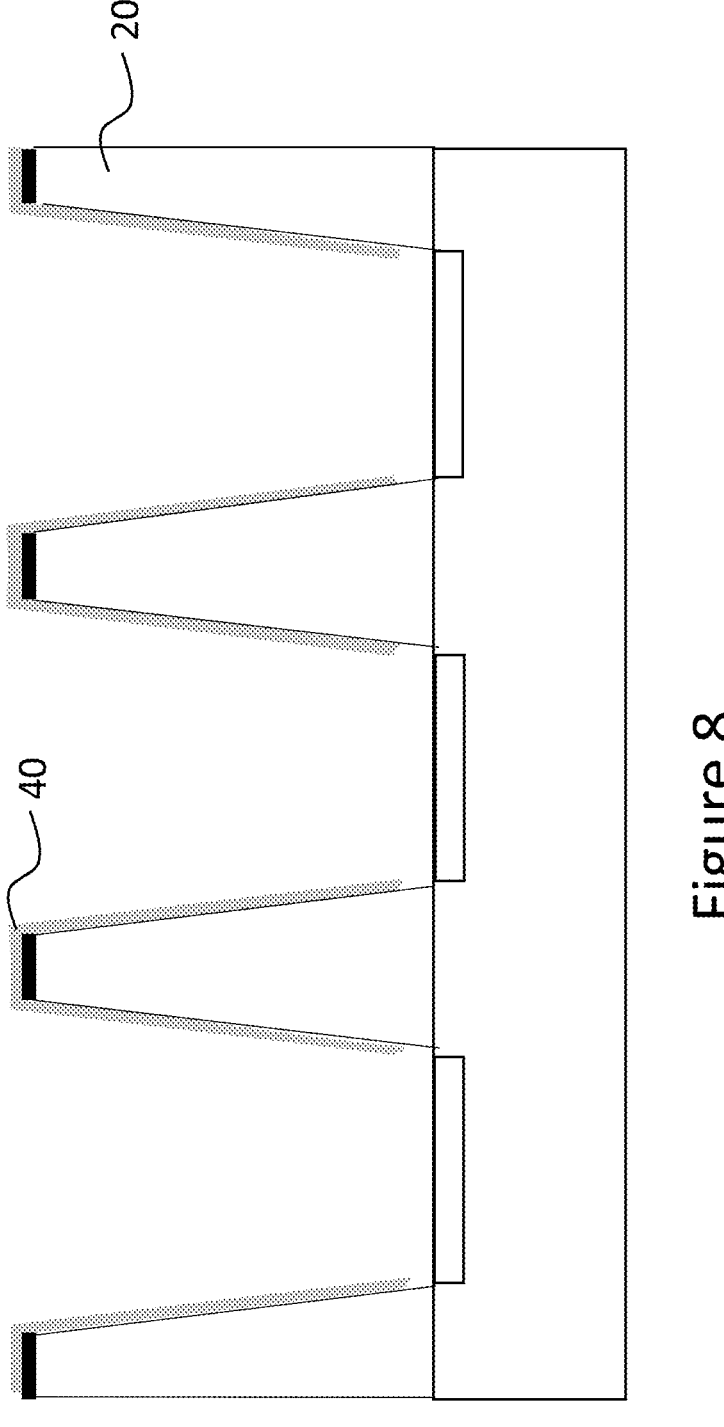

As shown in FIG. 8, the reflective material is then removed from the bottom of the apertures 25 by dissolving the underlying photoresist in a standard lift-off procedure—leaving the light emitting surfaces of the LEDs 11, 12 and 13 exposed and surrounded by the reflective internal surface provided by the aperture sidewalls. Any light emitted from the LEDs is then collimated before exiting its respective aperture 25.

Figure 9:
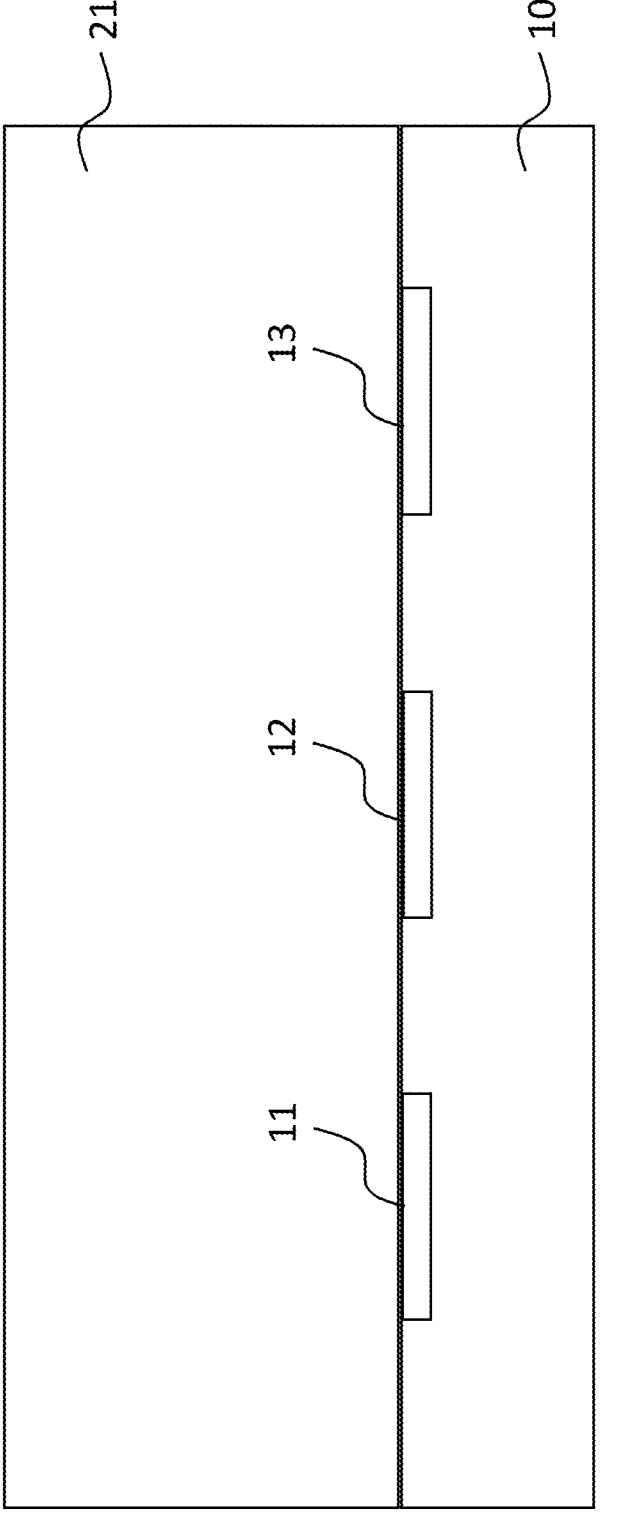
FIGS. 9-15 show stages of the manufacturing process for the LED array according to alternative embodiments of the invention.
Figure 10:
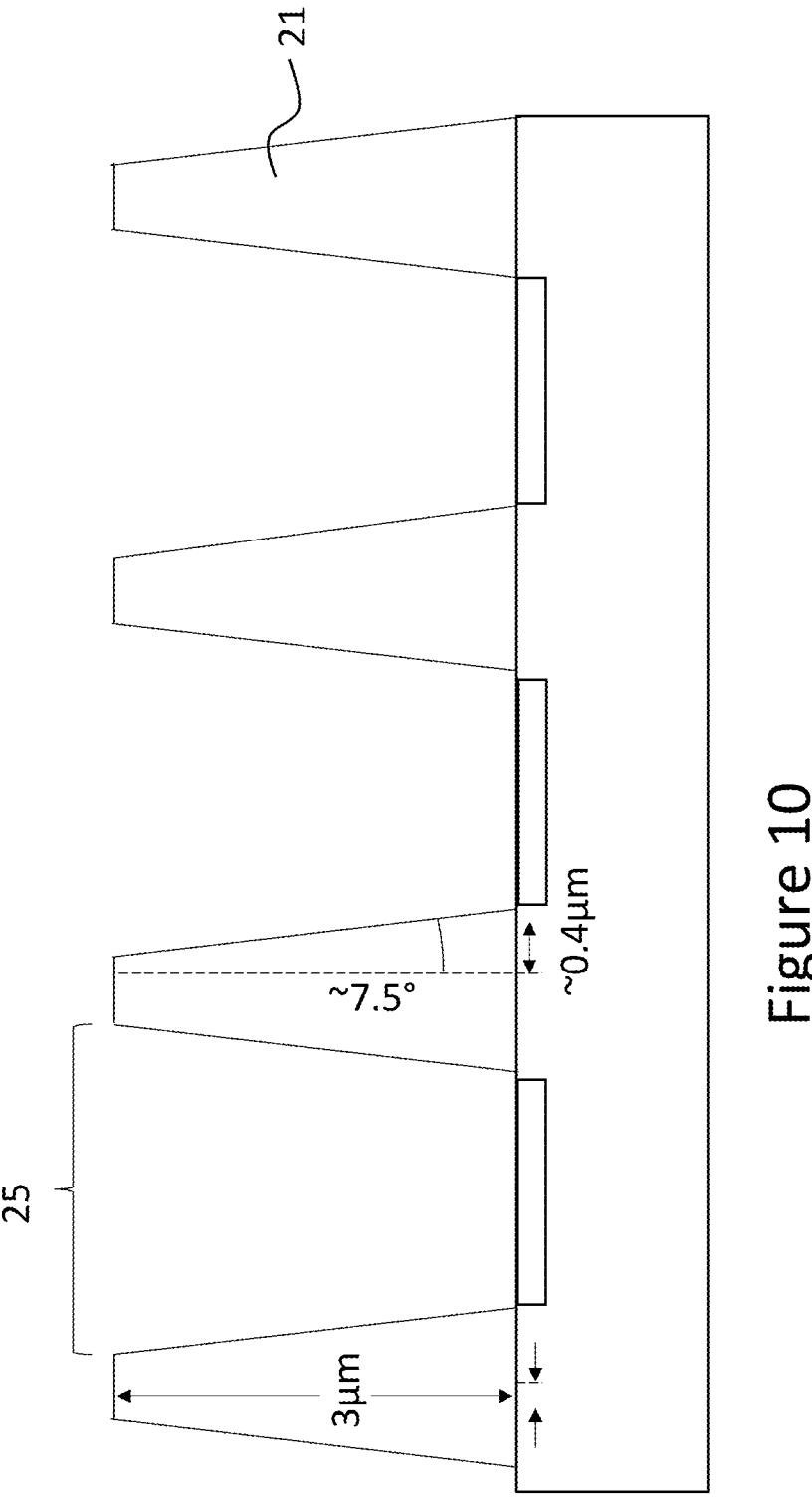

In an alternative embodiment, the dielectric layer containing the apertures is a photoimageable polymer layer in which the apertures are printed. The key steps of manufacturing the monolithic LED array 100 according to this embodiment are shown in FIGS. 9 and 10, which replace the steps shown in FIGS. 2-4 above. FIG. 9 depicts the step of coating the LED wafer 10 with a polymer layer 21. The thickness of the polymer layer is chosen to be the maximum possible within the constraints set by the width and pitch of the LEDs of the LED wafer 10 and the required sidewall angle of the conical apertures 25.

FIG. 10 shows the formation of the apertures 25 created in the polymer layer 21. These are created by photo-imaging the polymer layer with the required pattern, followed by an imprint or etch process. The displayed dimensions are for a 3 micron pitch LED wafer 10. The apertures 25 may also be created in the polymer layer by means of a moulding or imprinting method. The sidewalls of the apertures 25 are subsequently coated in a reflective layer as described in relation to FIGS. 5-8 above, or FIGS. 11-15 below.

In an alternative embodiment, the reflective material 40 is deposited and subsequently patterned using a post-deposition photo mask, etch and strip process. This process is illustrated by FIGS. 11-15 which replace those of FIGS. 5-8.

Figure 11:
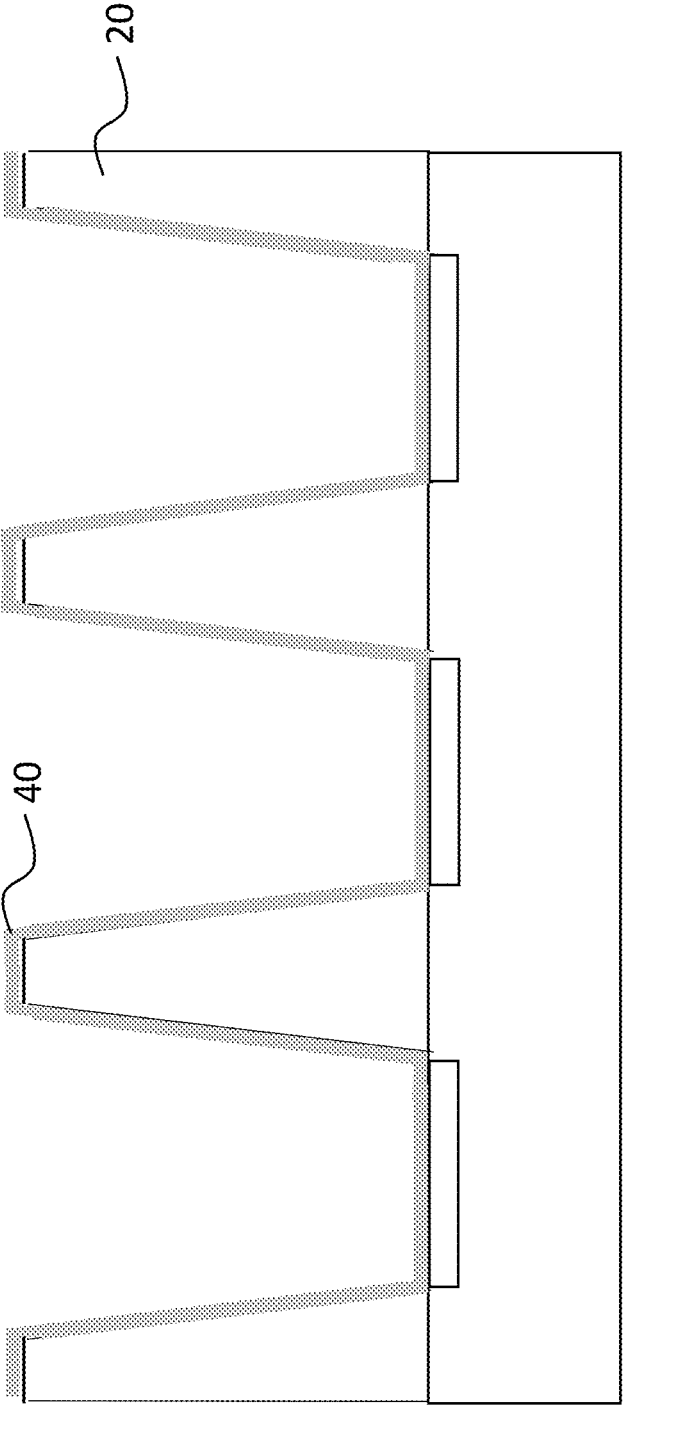

FIG. 11 shows the dielectric layer 20 coated with reflective material 40 such that the sidewalls of the apertures are conformally coated.

Figure 12:
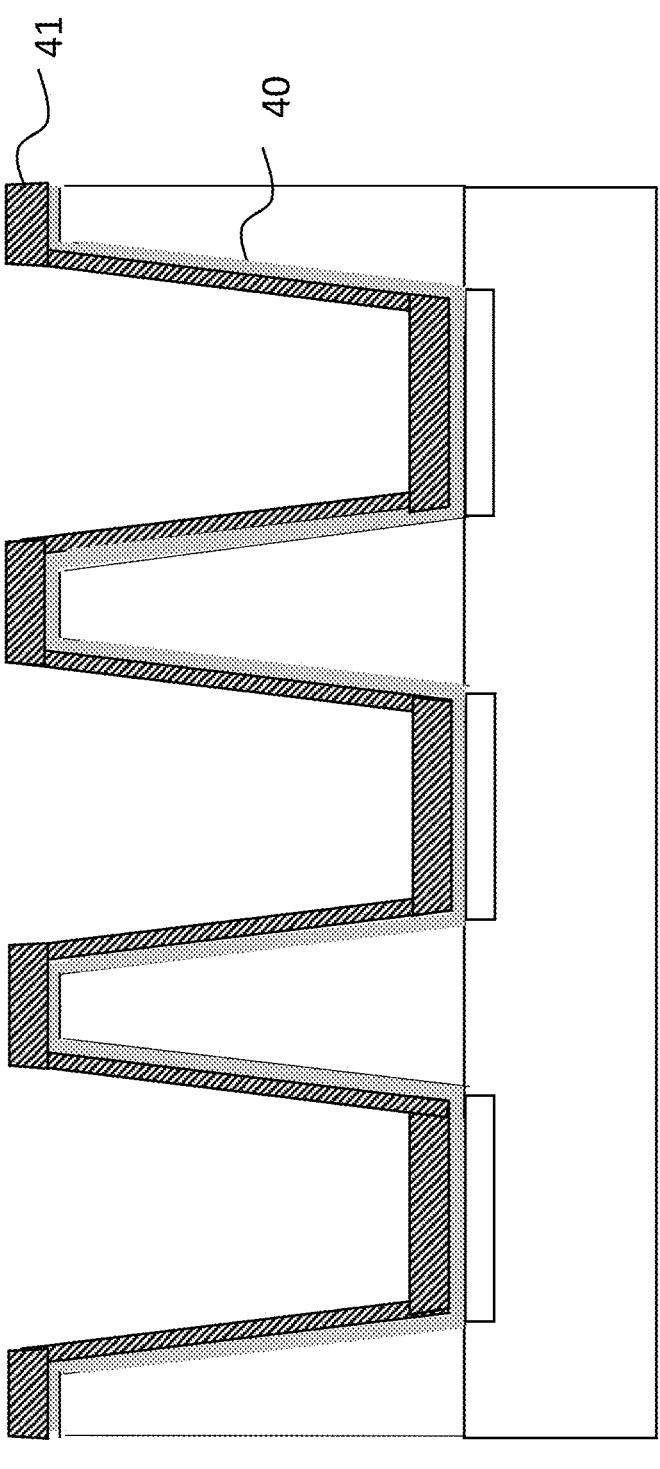

The reflective material 40 is then coated with an etch resistant material 41 that is also applied to the area over the aperture sidewalls, as shown in FIG. 12.

Figure 13:
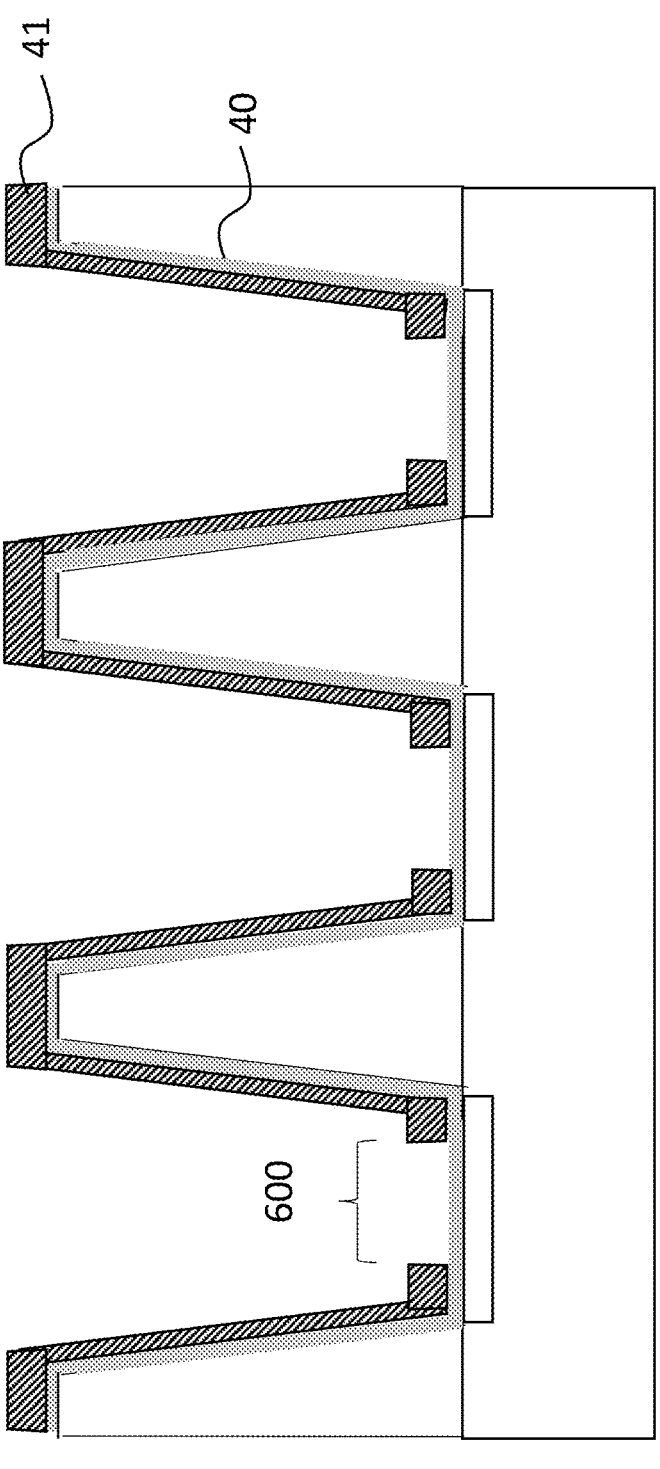

FIG. 13 depicts a series of apertures 600 being created in the etch resistant material 41. In an embodiment this performed via a masked photo exposure and develop process. In an alternative embodiment this step is performed via a self-aligning spacer process.

Figure 14:
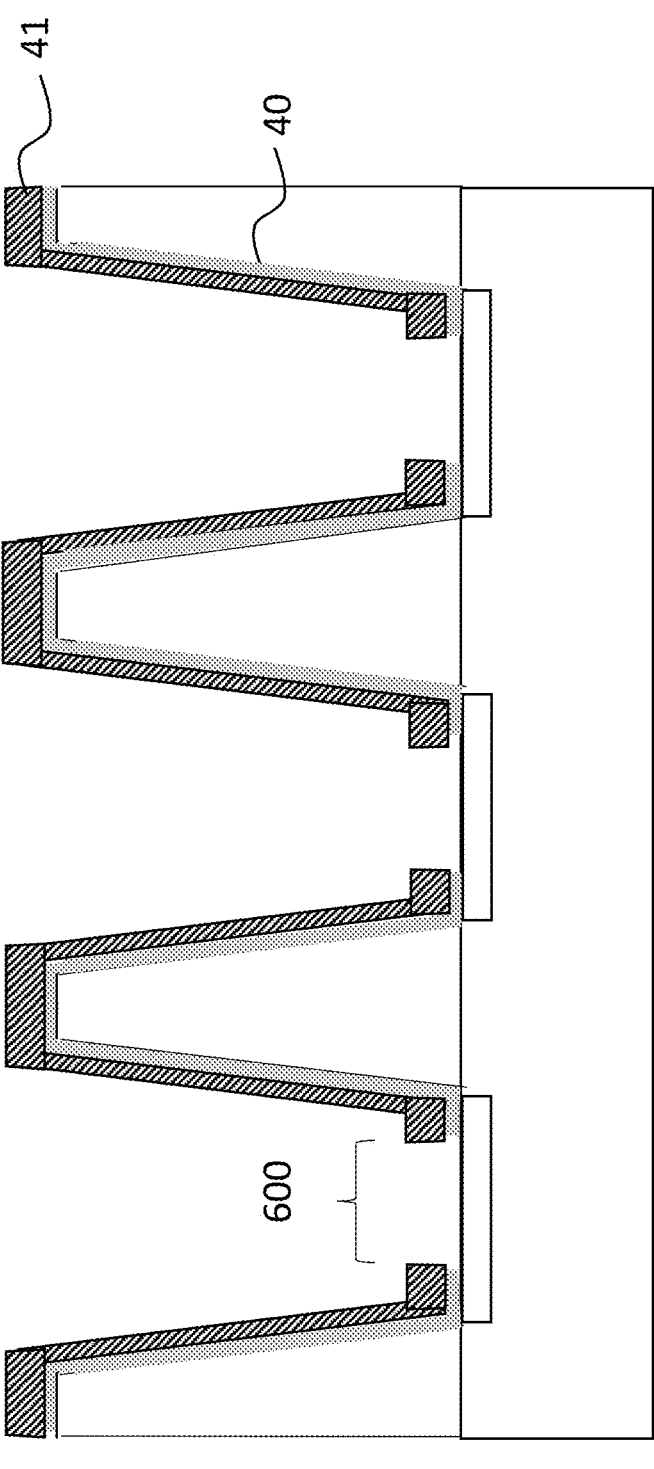
Figure 15:
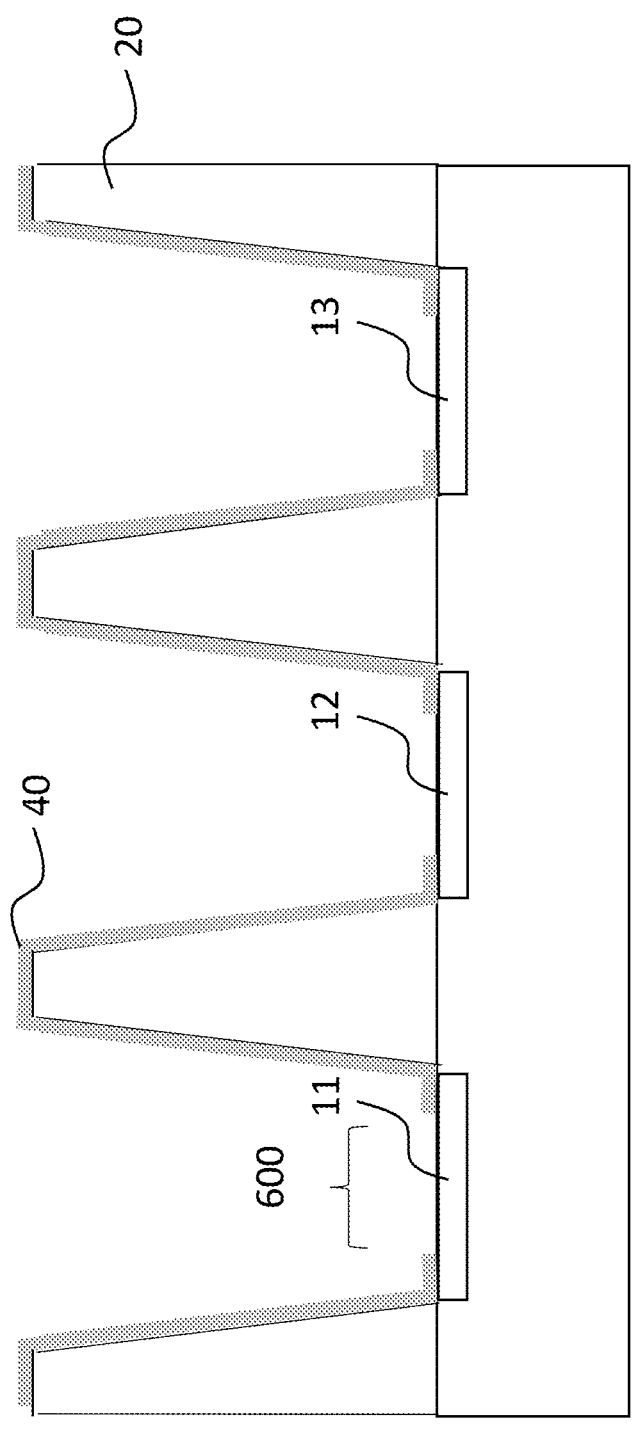

At the stage show in FIG. 14, the reflective material 40 is etched to create apertures in the areas not covered by the etch resistance material 41. The etch resistant material is subsequently removed producing the structure of FIG. 15.

The alternative processes for defining the apertures 25 and patterning the reflective material 40 (described in relation to FIGS. 9 and 10 and FIGS. 11-15 respectively) are not mutually exclusive, such that either, neither or both could be employed to provide the monolithic array 100.

Figure 17:
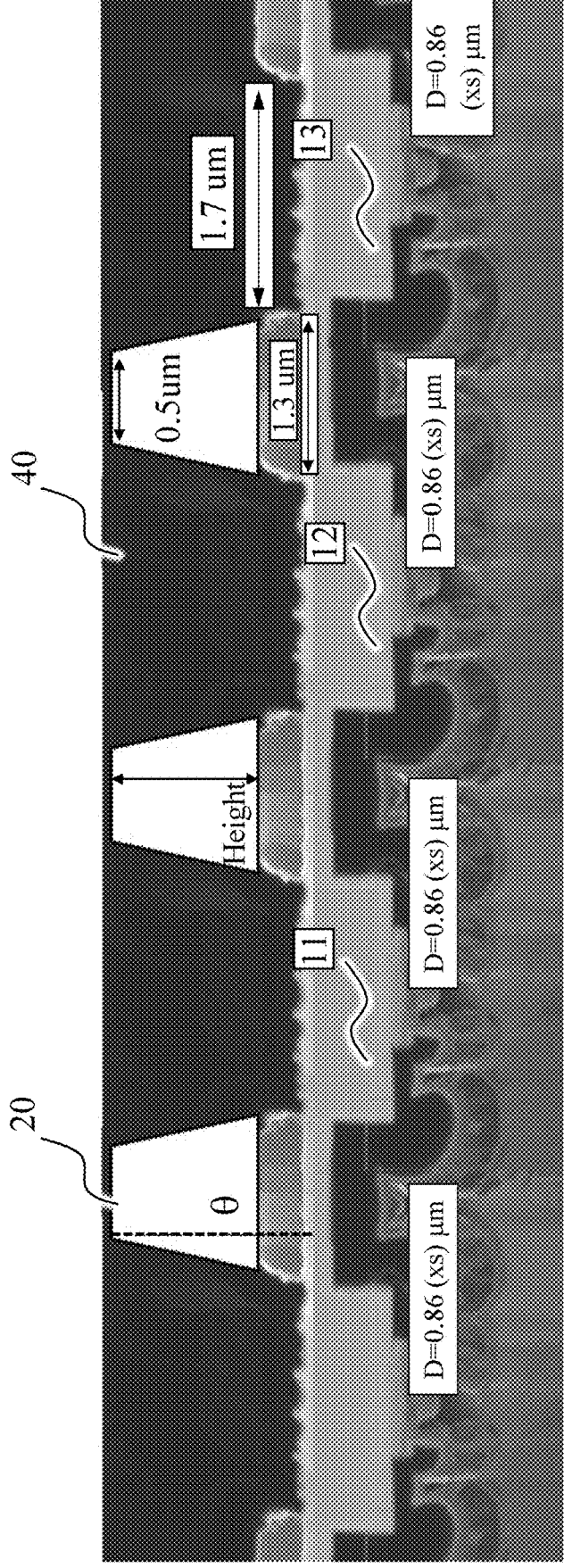
FIG. 17 shows a cross-sectional view of a portion of a monolithic LED array taken via electron microscopy.
Figure 19A:
FIG. 19 shows the light emission distribution for different reflective aperture heights (H=1 micron, 2 micron, 3.5 micron and 5 micron) for a pitch of 3 micron.
Figure 19B:
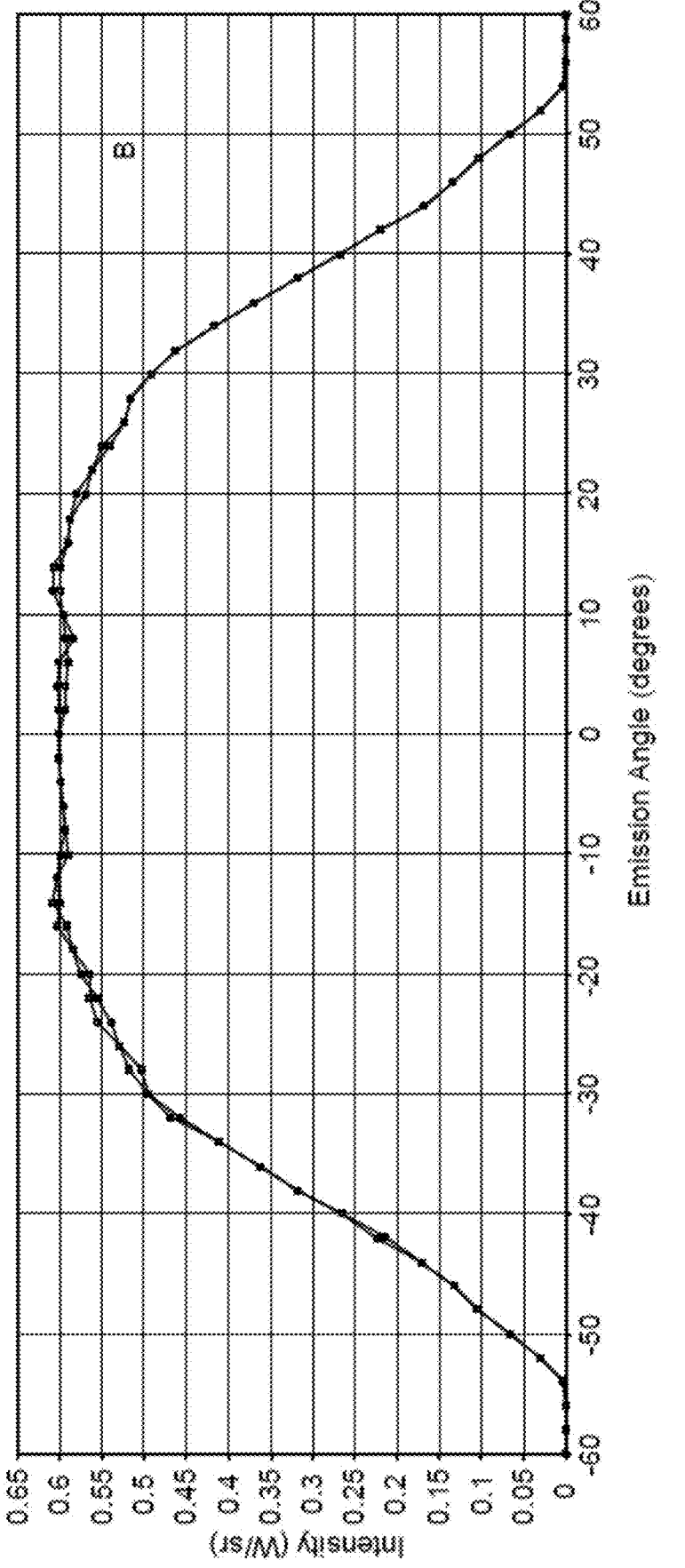
Figure 19C:
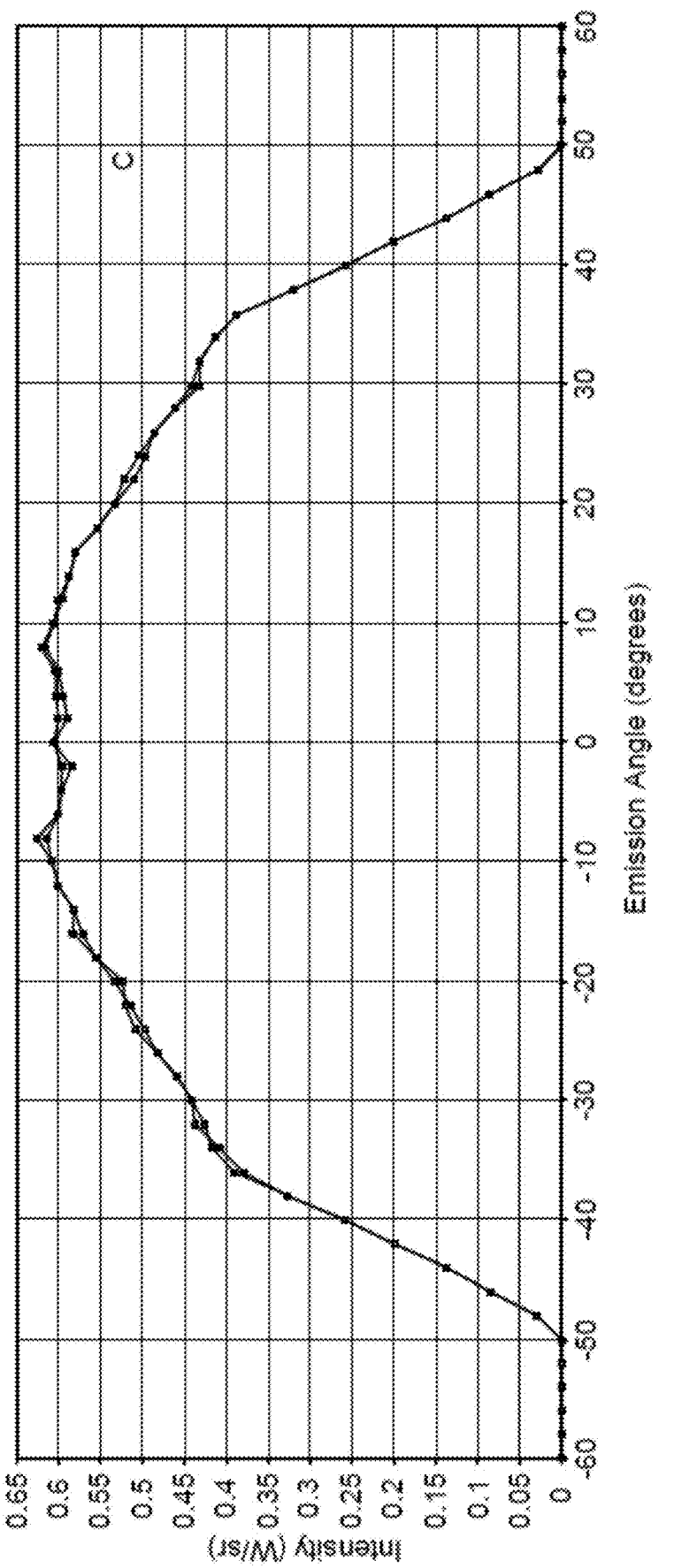
Figure 19D:
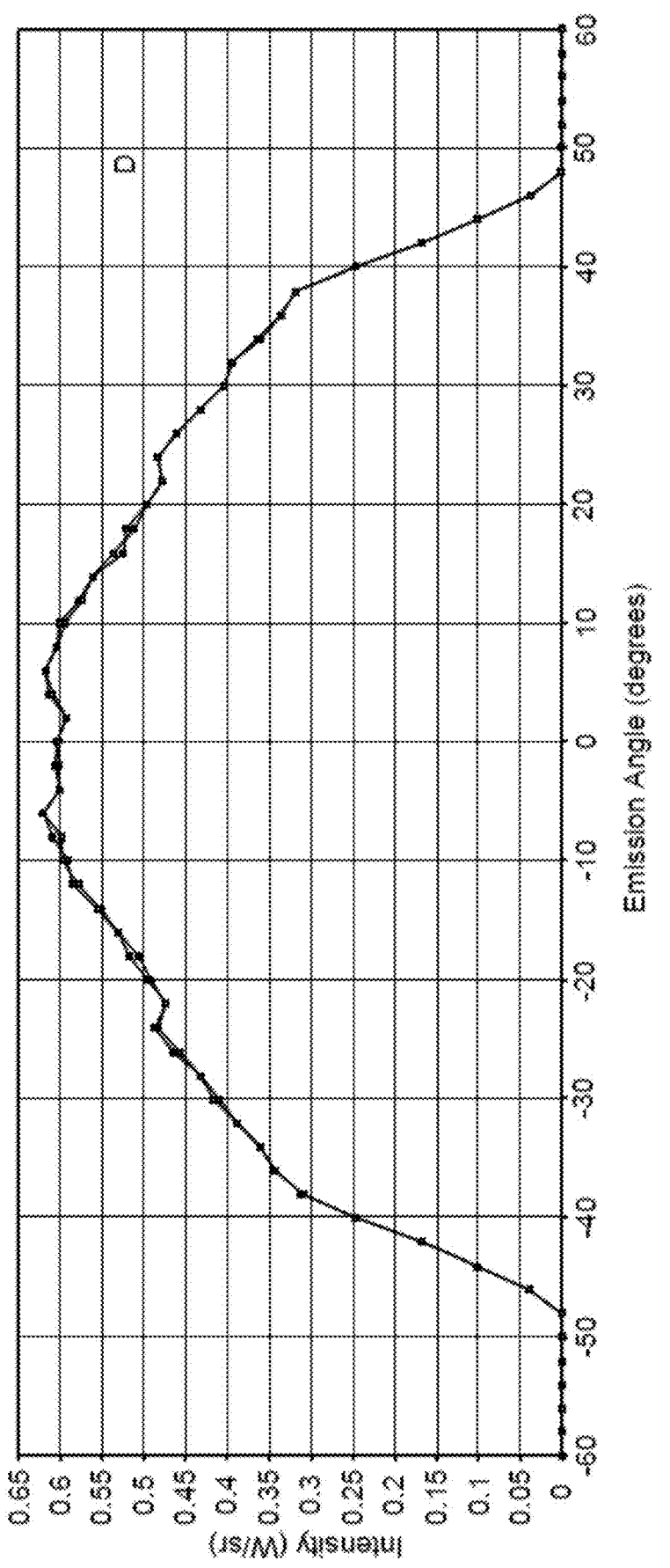

FIG. 17 shows a cross-section of the monolithic LED array 100 taken using an electron microscope, showing distances between the top and bottom openings of neighbouring apertures as 1.3 microns at their base (i.e. at the interface between the dielectric layer 20 and the LED wafer layer 10) and 0.5 microns at their top (the opposing surface of the dielectric layer).

FIG. 18 shows a table illustrating the angle theta of the sloped internal aperture wall with respect to a direction perpendicular to the plane formed by the opposing surface of the dielectric layer for corresponding heights of the reflective apertures 25 through the dielectric layer 20.

FIG. 19 shows the light emission distribution for different heights of the reflective apertures 25 (A=1 micron, B=2 micron, C=3.5 micron and D=5 micron) for a pitch of 3 microns where pitch is the inter-LED spacing of the LED wafer 10. As can be seen, the cut-off angle is reduced from 90° for a typical Lambertian distribution in the case of no reflective apertures 25 down to 48° for an aperture height of 5 microns.

Figure 20A:
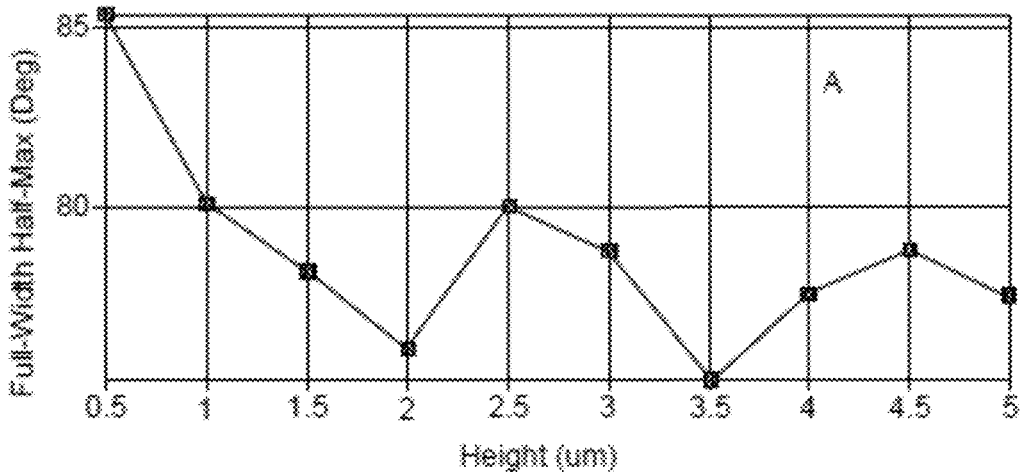
FIG. 20 shows various graphs plotting the full-width half-maximum angle (FWHM), optical efficiency and coupling efficiency to various lenses against the reflective aperture height for a micro LED device of 3 micron pitch.

As shown in the simulation results of FIG. 20A (which assumes a mirror finished surface of the reflective material and a Lambertian distribution for light emitted from the LEDs), the Full-Width-Half-Maximum of the emitted light is reduced from 120° to below 80° for aperture heights greater than 1 micron.

Figure 20B:
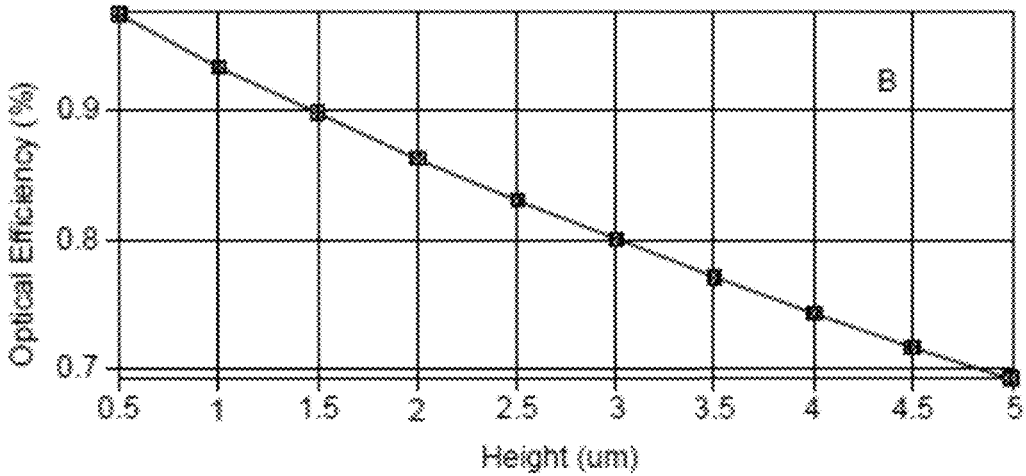
Figure 20C:
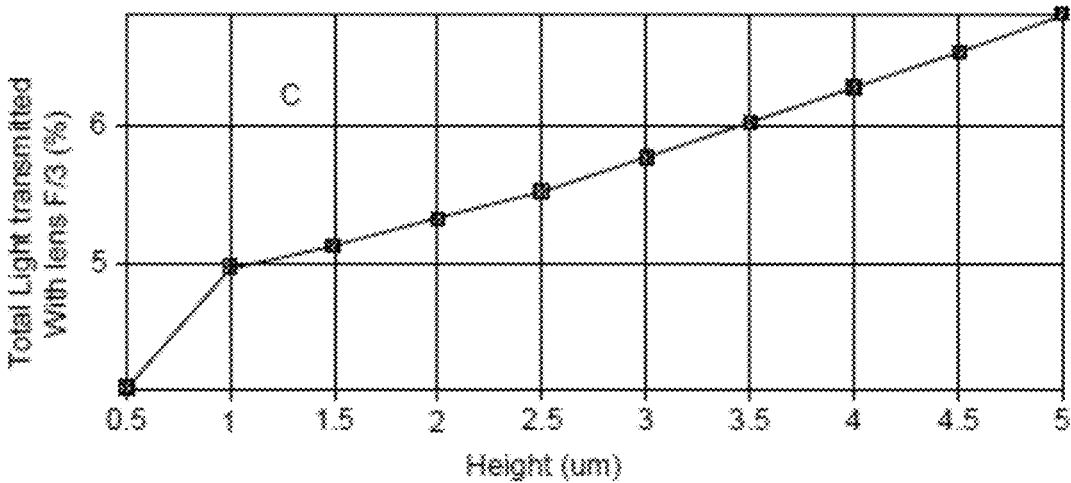
Figure 20D:
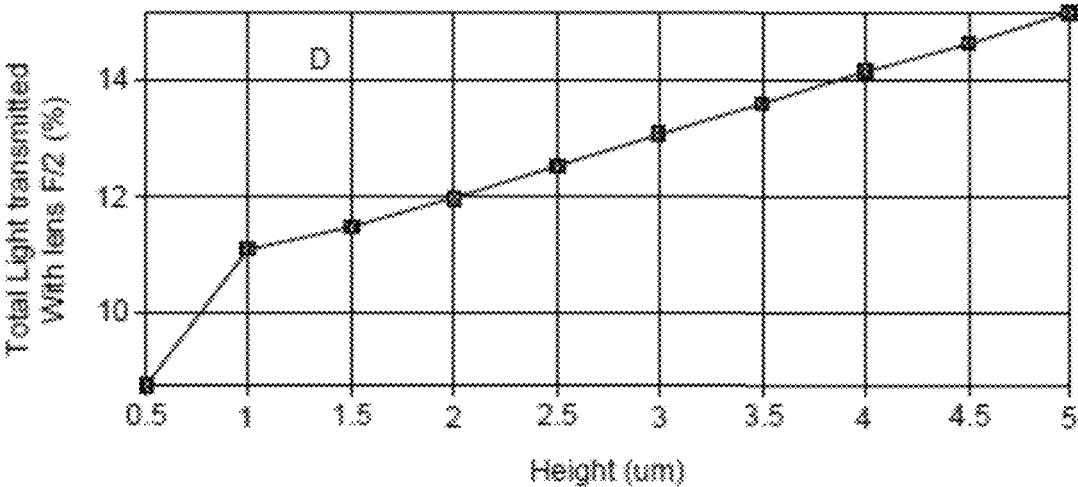
Figure 20E:
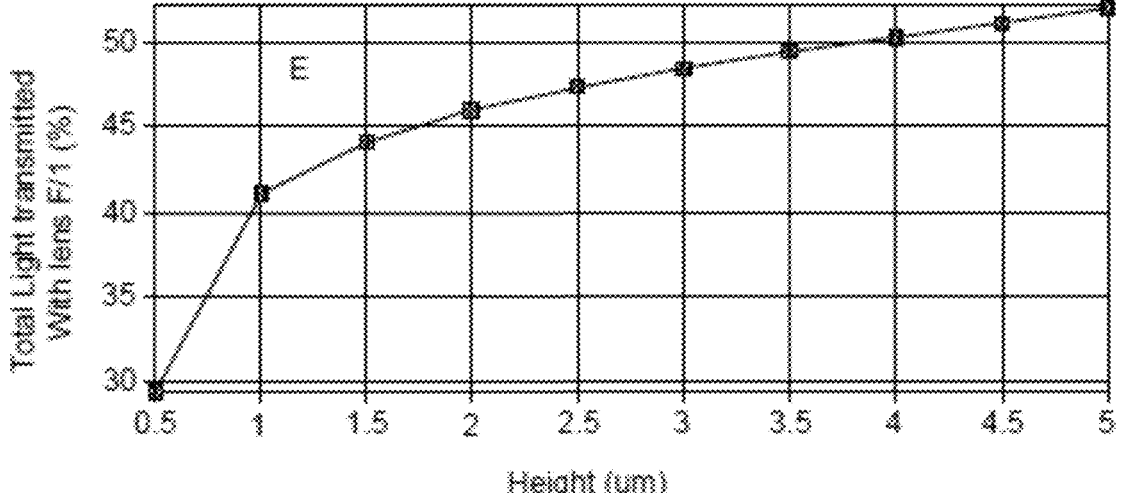

FIGS. 20C-E show the resulting increase in the optical coupling to an F/3, F/2 and F/1 lens with aperture height, whereby a greater proportion of the now collimated light exiting the apertures 25 is within the acceptance angle of the lens.

Figure 21:
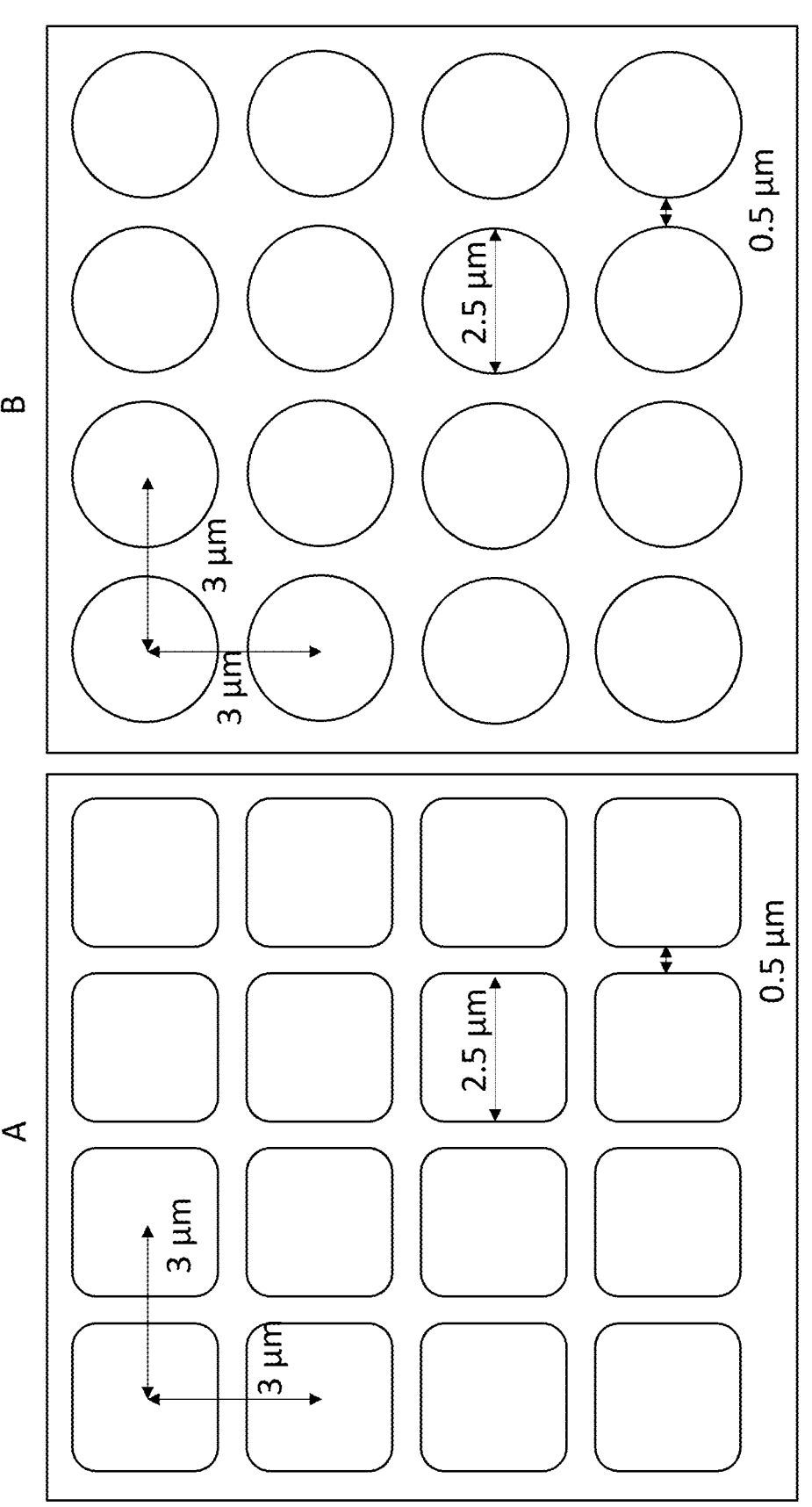
FIGS. 21 and 22 show typical mask layouts that are used in the formation of the monolithic LED array according to an embodiment of the invention.

FIG. 21 shows an example mask that can be used to pattern the dielectric layer 20 dimensioned for an array of 1.7 micron wide LEDs at a three micron pitch with a 3 micron thick dielectric layer 20. The exact shape of the windows (square in FIG. 20A and circular in FIG. 20B) naturally depends on that of the LEDs that make up the array.

Figure 22:
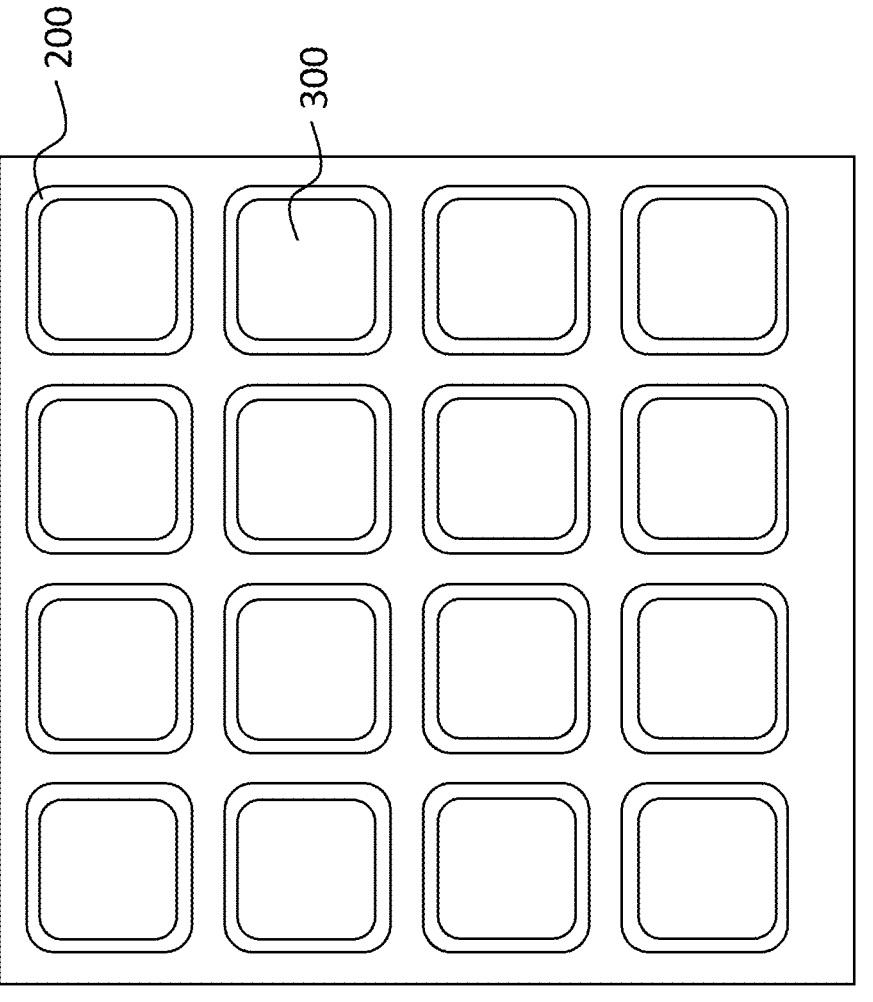

FIG. 22 shows a first mask 200 used to pattern the dielectric layer 20, aligned with a second mask 300 used in the lift-off process of the reflective material 40.

Accordingly there is provided a monolithic LED array 100 in accordance with the invention.

What is claimed is:

1. A method of manufacturing a micro light emitting diode array comprising a first layer having a plurality of light emitting diodes arranged to emit light from a light emitting surface of the first layer, the method comprising:

depositing a layer of dielectric material over the light emitting surface of the first layer, wherein the dielectric layer is a thickness between 1 and 5 microns;

subsequently forming a plurality of apertures extending through the deposited layer of dielectric material, each aperture having an internal surface;

subsequently coating the internal surfaces with a reflective material;

wherein at least one aperture of the plurality of apertures is centered on and aligned with a light emitting diode of the plurality of light emitting diodes of the first layer and is frustum shaped, such that light emitted from light emitting diode is collimated as it passes through the at least one aperture.

2. The method of claim 1 wherein the dielectric layer has a first surface extending over the light emitting surface of the first layer and a second opposing surface, and wherein the plurality of apertures are formed such that each aperture comprises a first opening in the first surface of the dielectric layer and a second opening in the second surface of the dielectric layer, wherein the second opening is larger than the first opening such that the apertures are frustum shaped.

3. The method of claim 2 wherein the first opening corresponds to the area of the underlying light emitting diode.

4. The method claim 1 wherein the apertures are frusto-conical.

5. The method of claim 1 wherein the apertures are formed such that the internal surface of the aperture is slanted at an angle of 7.5 degrees with respect to a plane normal to the dielectric layer.

6. The method of claim 1 wherein the reflective material is aluminium.

7. The method of claim 1 wherein the reflective material is deposited using a High-target-utilization sputtering (Hi-TUS) process.

8. The method of claim 1 wherein the light emitting diodes of the first layer are spaced 3 microns apart.

9. The method of claim 8 wherein the dielectric layer is formed of one of silicon dioxide or a polymer.

10. The method of claim 1 wherein the step of forming the plurality of apertures in the dielectric layer comprises depositing a hard mask material onto the second surface of the dielectric layer and patterning the hard mask material so as to expose areas of the dielectric layer that define a maximum width of the apertures, said maximum width being greater than the corresponding dimension of the underlying light emitting diode.

11. The method of claim 10 wherein the hard mask material is tungsten.

12. The method of claim 10 further comprising the step of etching the exposed areas of the dielectric layer so as to produce an aperture having a slanted internal surface that extends from an opening in the second surface of the dielectric layer defined by the hard mask material to an opening in the first surface of the dielectric layer, wherein the opening in the first surface corresponds to the area of the underlying light emitting diode.

13. A method of manufacturing a light emitting diode array comprising a first layer having a plurality of light emitting diodes arranged to emit light from a light emitting surface of the first layer, the method comprising:

depositing a layer of dielectric material over the light emitting surface of the first layer, forming a plurality of apertures extending through the layer of dielectric material, each aperture having an internal surface that is at least partially reflective;

wherein at least one aperture of the plurality of apertures is centered on and aligned with a light emitting diode of the plurality of light emitting diodes of the first layer, such that light emitted from light emitting diode is collimated as it passes through the at least one aperture;

wherein the step of forming the plurality of apertures in the dielectric layer comprises depositing a hard mask material onto the second surface of the dielectric layer and patterning the hard mask material so as to expose areas of the dielectric layer that define a maximum width of the apertures, said maximum width being greater than the corresponding dimension of the underlying light emitting diode.

14. The method of claim 13, wherein the hard mask material is tungsten.

15. The method of claim 13, further comprising the step of etching the exposed areas of the dielectric layer so as to produce an aperture having a slanted internal surface that extends from an opening in the second surface of the dielectric layer defined by the hard mask material to an opening in the first surface of the dielectric layer, wherein the opening in the first surface corresponds to the area of the underlying light emitting diode.

* * * * *